(12) United States Patent
Morita et al.

(10) Patent No.: US 6,335,901 B1
(45) Date of Patent: Jan. 1, 2002

(54) SEMICONDUCTOR DEVICE

(75) Inventors: Sadayuki Morita, Higashiyamato; Takeshi Sakata, Kodaira; Satoru Hanzawa, Hachiouji; Takahiro Sonoda, Fussa; Haruko Tadokoro, Higashimurayama; Hiroshi Ichikawa, Hachiouji; Osamu Nagashima, Hamura, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/531,467

(22) Filed: Mar. 20, 2000

(30) Foreign Application Priority Data

Aug. 31, 1999 (JP) .......................................... 11-245820

(51) Int. Cl.[7] ................................................ G11C 8/00
(52) U.S. Cl. ....................................... 365/233; 365/194
(58) Field of Search ............................. 365/233, 233.5, 365/194, 191, 227, 229

(56) References Cited

U.S. PATENT DOCUMENTS 6,060,916 A * 5/2000 Park ............................ 327/99
6,091,663 A * 7/2000 Kim et al. .................... 365/233
6,151,271 A * 11/2000 Lee ............................. 365/233
6,151,272 A * 11/2000 La et al. ...................... 365/233

FOREIGN PATENT DOCUMENTS

JP 10302465 11/1998

OTHER PUBLICATIONS

"250MHz 64M bits DDR Synchronous DRA (x4/x8)", Takashi Honda, May 1999, vol. 66, No. 1, pp. 33–36.

* cited by examiner

Primary Examiner—Richard Elms
Assistant Examiner—Anh Phung
(74) Attorney, Agent, or Firm—Antonelli, Terrym, Stout & Kraus, LLP

(57) ABSTRACT

An SDRAM has its operation mode selected to be the SDR mode in response to the first state of the external terminal (OPT), thereby releasing data, which has been read out of a memory mat, in response to a clock signal produced by a clock regenerating circuit having a function of comparing the phases of the input and output of the circuit, or selected to be the DDR mode in response to the second state of the external terminal (OPT), thereby releasing data, which has been read out of the memory mat, in response to a clock signal produced by a clock signal generation circuit in synchronism with an external clock signal.

38 Claims, 15 Drawing Sheets

SDR-SPEC SDRAM

DETAILS OF Y-DECODER

SEMICONDUCTOR DEVICE

BACKGROUND OF THE INVENTION

The present invention relates to the technology of semiconductor devices, and particularly to a semiconductor device which is suitable for an SDRAM (Synchronous Dynamic Random Access Memory) which can be switched to perform a SDR (Single Data Rate) operation and a DDR (Double Data Rate) operation.

Synchronous memories such as SDRAMs have their operational timing controlled based on an external clock signal such as a system clock signal supplied from the outside. Synchronous memories of this type are characterized by relatively easy treatment of the internal operational timing by use of the external clock signal and the ability to achieve relatively fast operation.

SDRAMs are known which perform SDR type operations, in which data input/output is timed to the rising edge of the external clock signal, and DDR type operations, in which data input/output is timed to both the rising and falling edges of the external clock signal.

SUMMARY OF THE INVENTION

SDRAMs of the SDR type can operate relatively fast and can be used easily for general electronic systems which operate under control of a clock signal. Specifically, the relation between data input/output and the external clock signal, i.e., data input/output timed to the rising edge of the external clock signal, of the SDR-type SDRAM is fairly analogous to the operation of general electronic systems, in which operations are timed to the rising or falling edge or the transition from a low level to a high level (or from high to low) of the clock signal, or, in other words, it is analogous to the relation between the clock signal and the signal to be transferred in general electronic systems which operate by being timed to the leading edge or trailing edge of a clock signal.

In contrast, SDRAMs of the DDR type operate for data input/output by being timed to the rising and falling edges of a clock signal. Although DDR-type SDRAMs involve application electronic systems having some intricate timing design, these SDRAMs perform twice the data input/output operations per unit time as SDR-type SDRAMs at the same clock frequency. Namely, DDR-type SDRAMs are capable of faster data access.

SDRAMs of the SDR type and DDR type have similar characteristics such as the introduction of external control signals and command signals in synchronism with the external clock signal, the address input operation, and the data input/output operation, and have like circuit arrangements of the memory cell matrix and associated address selection circuit and the peripheral circuits such as the sense amplifiers and main amplifiers.

The inventors of the present invention have studied the design of a uniform semiconductor chip which can be employed both as an SDR-spec SDRAM and a DDR-spec SDRAM by switching. Accomplishing this semiconductor chip design enables the common use of photolithography masks for fabricating both SDR-spec and DDR-spec SDRAMs and the implementation of a common fabrication process and a common test process for both SDRAMS. As a result, the reduction of manufacturing cost can be expected.

Another expectation, which is derived from the configuration of any of the SDR-spec and DDR-spec SDRAMs embodied in a uniform semiconductor chip, is the potential capability to meet an increased demand of any type of SDRAMS.

In the course of the in-depth studies on the designing of SDR-spec and DDR-spec SDRAMs embodied in a uniform semiconductor chip, the inventors of the present invention have found the presence of the following problems to be solved.

(1) Problem on the Internal Clock System

It is necessary for the internal circuits of an SDRAM to be operative by being timed to both the rising edge and falling edge of the external clock signal so that the SDRAM can operate in the DDR mode. In this case, for controlling the internal circuits to operate in response to the rising and falling edges of the external clock signal, it is desired to generate an internal clock signal which is timed to both the rising and falling edges of the external clock signal, i.e., transitions from one level to another timed to the rising edge and falling edge of the external clock signal, so that the internal circuits operate in response to the rising and falling edges of the external clock signal.

Clock-based componential circuits, such as the input buffer, which operate in response to the external clock signal have inevitably a time lag or phase shift of the output signal relative to the input signal. Regardless of this inevitable output delay of componential circuits which base their operation on the external clock signal, it is desirable for the internal clock signal to have a reduced phase shift relative to the external clock signal. Another crucial design factor in the case of the relatively fast operation in the DDR mode is the generation of an internal clock signal in consideration of the operation delay of the internal circuits. It is desired to connect the semiconductor device to an external device such as a memory controller or microprocessor in a proper timing relation with the external clock signal regardless of the operation delay in the internal circuits. More desirable operation of the semiconductor device is made possible by providing an internal clock signal which has a leading phase relative to the external clock signal to a sufficient extent to compensate for the operation delay of the internal circuits. In order to produce an internal clock signal with a proper phase relation regardless of the operation delay and phase shift of the componential circuits, a clock regenerating circuit provided in the SDRAM for producing the internal clock signal from the external clock signal is designed to use the functions of signal phase judgement and adjustment, called DLL (delayed lock loop), PLL (phase-locked loop) and SMD (synchronous mirror delay), and to use the known circuit technique of signal phase control for producing a signal which is synchronized and phase-controlled to the input signal.

The clock-based circuit which produces an internal clock signal from the external clock signal for the device operation in SDR operation (or SDR mode or SDR specification) can conceivably be shared with the circuit for the DDR operation to achieve simplification of the whole uniform semiconductor chip. Nevertheless, these circuits are desirably separate from the clock-based circuit for the DDR operation under the following technical considerations.

Signals such as system clock signals produced in electronic systems are not necessarily designed to have a constant period and constant phase. Instead, it is even desirable for some electronic systems to have their clock period changed periodically. For example, in an electronic system operating based on a clock signal, a change of operation current of a clock-based circuit often produces a noise of a relatively large level. In case the clock period is changed periodically, noises attributable to the clock signal have their frequency spectrum dispersed by the alteration of the clock period, resulting in a reduced noise level at certain frequencies. For the effective dispersion of the noise frequency spectrum, it is desirable to change the clock period in a short interval, such as in every one or several clock cycles.

On the other hand, the above-mentioned circuit technique of signal phase control generally necessitates multiple clock cycles for phase control, and therefore it is not easily responsive to fast changing clock periods intended for the dispersion of the noise frequency spectrum. On this account, it should be a primary aim for the DDR mode to produce a fast clock signal from the external clock signal. In contrast, for the SDR mode, the internal clock signal virtually corresponds with the external clock signal, and it is desirably highly responsive to changing periods of the external clock signal.

Therefore, it is desirable to design separate clock-based circuits for the SDR mode and DDR mode.

(2) Problem on the Data Transfer Line

In the SDR-spec SDRAM, there are states in which read-out data and input data to be stored are processed simultaneously, whereas in the DDR-spec SDRAM, such states can be prevented.

In case a large number of data transfer lines are laid on a semiconductor chip so that it is adapted to both SDR and DDR modes simply, it will be necessary to provide an increased area for the layout of lines. This gives rise to problems of the chip cost and chip size.

(3) Problem on Data Input Timing Control

In the SDR-spec SDRAM, external data supply is enabled in the same clock cycle as that of the external command of a write operation, whereas in the DDR-spec SDRAM, external data supply is enabled in the clock cycle next to the clock cycle of the external command of a write operation. Accordingly, the SDR-spec SDRAM and DDR-spec SDRAM must receive input data to be stored at different timings of supply. Therefore, the data input circuit must have different operations for the SDR-spec SDRAM and DDR-spec SDRAM.

(4) Problem on Mask Register Control

In correspondence to the difference of the data input of writing between the SDR-spec SDRAM and DDR-spec SDRAM, it becomes necessary to have different control timings (data mask control timings) for validating or invalidating data supplied to the data input circuit depending on the type of SDRAM.

(Relation to Prior Art)

Based on the survey conducted after the present invention was made, the inventors of the present invention have found the presence of the following patent publications. The following comments concern the relationship between the present invention and these publications.

Japanese Patent Unexamined Publication No. Hei 10(1998)-302465 discloses a semiconductor memory device which is "intended to improve the productivity and reduce the manufacturing cost based on the adoption of an option system which enables the selection of SDR mode and DDR mode" (quoted from paragraph number 0007). Specifically, the memory device is designed to include, at the location between a clock buffer for receiving an input clock signal and a pulse generator, a shift register which reverses its output signal level in response to the transition in one direction of the clock signal and a relay device, i.e., multiple inverters, which reverses its output signal level in response to the transition in both directions of the clock signal, with either the path of the shift register or the path of relay device being selected by the master signal of a mode selector. The mode selector which implements the switching based on the master signal has photo-mask switches or has NMOS transistors and fuses. A pulse generation circuit, which is made up of an inversion-delay means and logic means constituting an edge detecting circuit as a whole, produces a pulse signal in response to each of the rising edge and falling edge of the output signal from the shift register or the relay device.

However, the pulse generation circuit described in the Patent Publication No. Hei 10(1998)-302465 is a relatively simple circuit made up of a delay circuit and logic circuit, and the publication does not disclose any innovative arrangement intended for high-speed operation based on the compensation of the delay characteristics of the PLL, DLL and SMD circuits that the present invention is concerned with. Accordingly, this publication does not reveal the above-mentioned problems pointed out by the inventors of the present invention.

Moreover, this Patent Publication No. Hei 10(1998)-302465 does not describe the signal switching scheme and line routing scheme to be considered for enabling the switching among multiple operation modes, as will be explained in detail later, besides the switching of internal clock signals.

It is an object of the present invention to provide a semiconductor device which is based on the innovative scheme of operation mode switching of a synchronous memory.

Another object of the present invention is to provide the technique of operation mode switching for SDRAMS.

Still another object of the present invention is to provide an innovative semiconductor device having multiple clock signal generation circuits with different operational characteristics for the input signal.

Still another object of the present invention is to provide a semiconductor device for an SDRAM having an operation mode switching ability which is responsive to changing clock signal periods.

Still another object of the present invention is to provide a semiconductor device for an SDRAM having an operation mode switching ability including operations with different data input timings.

Still another object of the present invention is to provide a semiconductor device which is operative in multiple modes and can have a relatively small line layout area.

Still another object of the present invention is to provide a line layout technique which enables signal transfer adapted to operation mode switching.

Still another object of the present invention is to provide a line layout technique suitable for signal transfer.

Still another object of the present invention is to provide an SDRAM design technique which enables the switching of specifications and the reduction of manufacturing cost.

These and other objects and novel features of the present invention will become apparent from the following description taken in conjunction with the accompanying drawings.

Typical forms of the present invention are summarized as follows.

(1) A semiconductor device includes a mode signal generation circuit which produces a mode selection signal, a first clock signal generation circuit (will also be called clock signal output circuit or clock regenerating circuit hereinafter) which has functions of signal phase judgement and adjustment and produces an output clock signal which is synchronized with an input clock signal and is phase-controlled, and a second clock signal generation circuit (will also be called clock signal output circuit hereinafter) which produces another output clock signal based on the buffering of the input clock signal.

In operation, when the selection signal from the selection signal generation circuit is in a first state, the output clock signal from the first clock signal generation circuit is validated. Consequently, the clock-based internal circuits in the semiconductor device operate in accordance with the timing of the output clock signal provided by the first clock signal generation circuit.

When the selection signal is in a second state which is different from the first state, the output clock signal from the second clock signal generation circuit is validated.

In a typical example, the semiconductor device is an SDRAM, and the selection signal operates to select the SDR-spec or DDR-spec. For example, the selection signal in the first state causes the semiconductor device to configure an SDR-spec SDRAM, and the data read-out operation, for example, takes place in synchronism with the output clock signal of the clock regenerating circuit.

Otherwise, the selection signal in the second state causes the semiconductor device to configure a DDR-spec SDRAM, and the data read-out operation takes place in synchronism with the output clock signal of the second clock signal generation circuit.

(2) A semiconductor device includes a selection signal generation circuit which produces a selection signal and a data line switching circuit which operates under control of the selection signal generation circuit.

In operation, if the selection signal from the selection signal generation circuit is in a first state, data lines made up of first and second data lines are set by the data line switching circuit to become unidirectional data lines which can implement one of data transfer from one circuit node to another circuit node and data transfer from the other circuit node to the one circuit node. Otherwise, if the selection signal is in a second state which is different from the first state, the first and second data lines are set to become bidirectional data lines which can implement both of data transfer from one circuit node to another circuit node and data transfer from the other circuit node to the one circuit node.

In a typical example, the semiconductor device is an SDRAM, and the selection signal operates to select the SDR-spec or DDR-spec, as in the case of the item (1).

Specifically, if the semiconductor device configures an SDR-spec SDRAM in response to the selection signal in the first state, the data lines become unidirectional data lines, with one data line being a writing data line and another data line being a read-out data line. In other words, the data lines are separated for the transfer of data for writing and for read-out. Consequently, the semiconductor device can deal with an internal situation of simultaneous data read-out and data writing.

Otherwise, if the semiconductor device configures a DDR-spec SDRAM in response to the selection signal in the second state, the data lines become bidirectional data lines which function as writing data lines or read-out data lines depending on the operational timing.

This data line switching scheme reduces the number of data transfer lines laid on the semiconductor chip even in the case of providing the ability of adaption to both SDR-spec and DDR-spec SDRAMs, whereby the chip area can be kept small.

(3) A semiconductor device includes a selection signal generation circuit which produces a selection signal and a timing control circuit which operates under control of the selection signal generation circuit. A data input circuit has its data input timing varied in steps of a multiple of the clock signal period.

In a typical example, the semiconductor device is an SDRAM, and the selection signal operates to select the SDR-spec or DDR-spec, as in the cases of the items (1) and (2).

In operation, if the semiconductor device configures an SDR-spec SDRAM in response to the selection signal in the first state, the data input circuit is controlled to place data, which has been received on the data terminal, on the data transfer line at a time point which is later by one clock period than the write command input.

Otherwise, if the selection signal is in the second state, the data input circuit is controlled to place data, which has been received on the data terminal, on the data transfer line at the time point which is later by two clock periods than the write command input.

In consequence, it is possible for the uniform semiconductor device which is operative as SDR-spec or DDR-spec SDRAMs to transfer input data to be stored to the data transfer line at the optimal timing adapted to the data input timing of each mode.

(4) A semiconductor device includes a selection signal generation circuit which produces a selection signal and a mask control circuit.

In operation, when the selection signal is in a first state, input data on the data terminal is taken into the data input circuit in response to the clock signal, and a first control signal is taken into the mask control circuit in response to the clock signal.

Otherwise, when the selection signal is in a second state, input data on the data terminal is taken into the data input circuit in response to a second control signal, and the first control signal is taken into the mask control circuit in response to the second control signal.

In consequence, it becomes possible for the semiconductor device to have different control timings (data mask control timings) for the validation or invalidation of data supplied to the data input circuit for the SDR-spec SDRAM and DDR-spec SDRAM so as to be compatible with the different write data inputs of the SDR-spec and DDR-spec SDRAMs.

DESCRIPTION OF THE PREFERRED EMBODIMENT (Overall Arrangement)

Figure 1:
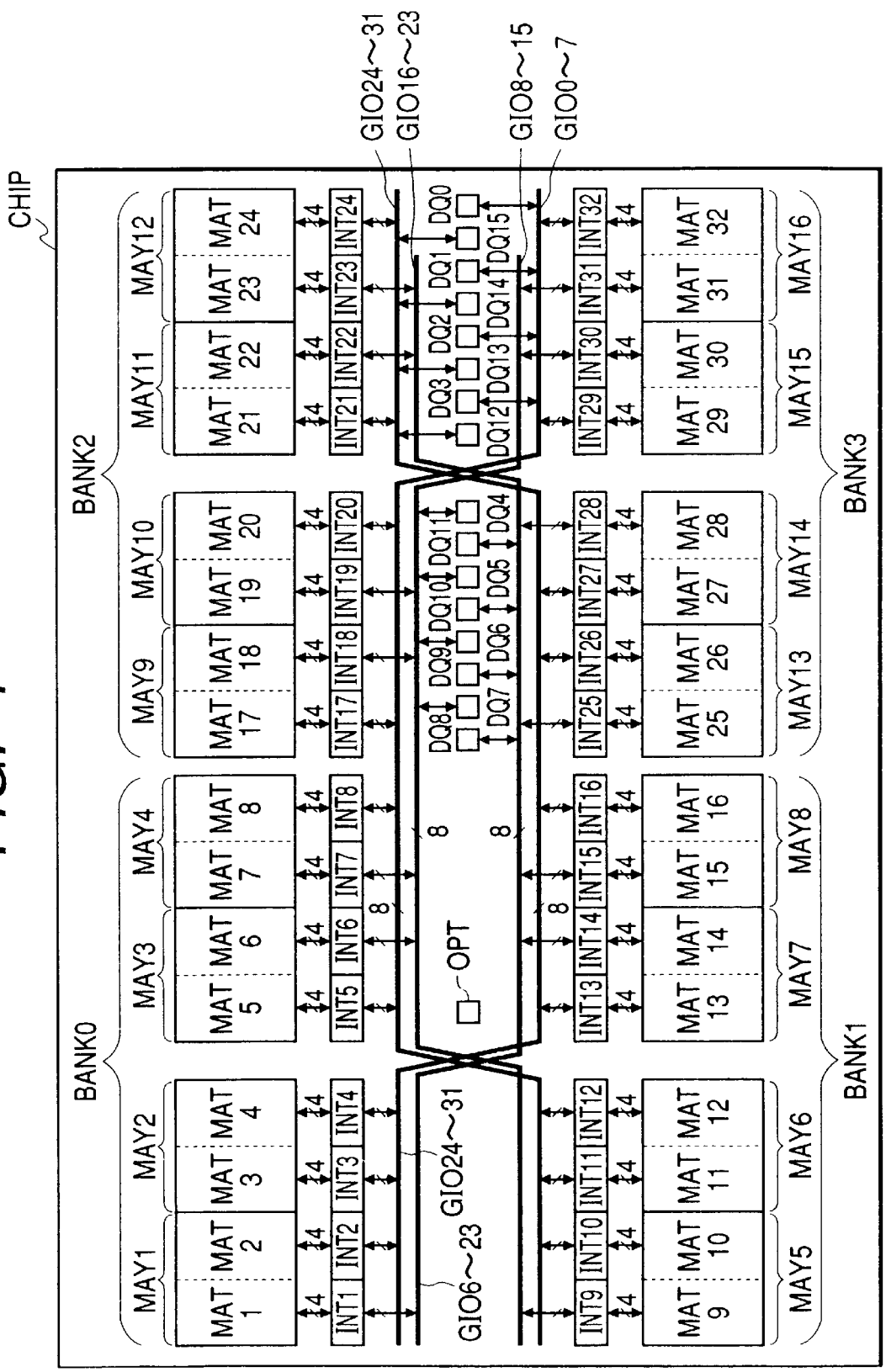
FIG. 1 is a block diagram showing the overall arrangement of a semiconductor device based on an embodiment of this invention.

FIG. 1 is an overall view of the semiconductor device (chip) based on an embodiment of this invention, showing the layout of only the principal circuit blocks, signal lines and terminals. This simplified schematic diagram is intended to show briefly the memory array and global data lines. The details of the circuit blocks, signal lines, and their layout will be set forth in more detail in the following figures and description.

The semiconductor device indicated by CHIP which forms an SDRAM is designed in the so-called bank structure, which includes four memory banks of Bank0, Bank1, Bank2 and Bank3 in this embodiment. Each memory bank consists of multiple memory arrays, and each memory array consists of multiple memory mats. The number of memory arrays in a memory bank and the number of memory mats in a memory array are determined depending on the storage capacity and the number of data bits accessed simultaneously.

In the semiconductor device shown in the figure, each memory bank includes four memory mats, although no limitation is imposed on this invention with regard to the number. Specifically, the memory bank Bank0 includes memory array MAY1–MAY4, the memory bank Bank1 includes memory array MAY5–MAY8, the memory bank Bank2 includes memory array MAY9–MAY12, and the memory bank Bank3 includes memory array MAY13–MAY16.

Each memory array consists of two memory mats. Specifically, the memory array MAY1 consists of memory mats MAT1 and MAT2, the memory array MAY2 consists of memory mats MAT3 and MAT4, the memory array MAY3 consists of memory mats MAT5 and MAT6, the memory array MAY4 consists of memory mats MAT7 and MAT8, the memory array MAY5 consists of memory mats MAT9 and MAT10, the memory array MAY6 consists of memory mats MAT11 and MAT12, the memory array MAY7 consists of memory mats MAT13 and MAT 14, the memory array MAY8 consists of memory mats MAT15 and MAT16, the memory array MAY9 consists of memory mats MAT17 and MAT18, the memory array MAY10 consists of memory mats MAT19 and MAT20, the memory array MAY11 consists of memory mats MAT21 and MAT22, the memory array MAY12 consists of memory mats MAT23 and MAT24, the memory array MAY13 consists of memory mats MAT 25 and MAT26, the memory array MAY14 consists of memory mats MAT27 and MAT28, the memory array MAY15 consists of memory mats MAT29 and MAT30, and the memory array MAY16 consists of memory mats MAT31 and MAT32.

Each memory mat is arranged similarly to a known dynamic random access memory, and therefore the detailed arrangement thereof is not shown. The memory mat includes multiple dynamic memory cells in a matrix arrangement, multiple word lines each connected to the selection terminal of a corresponding row of memory cells, and multiple bit lines (or data lines) each connected to the data terminal of a corresponding column of memory cells. Each dynamic memory cell is arranged similarly to a known memory cell of one transistor per cell structure, i.e., it consists of an information storage capacitor and a switch element such as a MOSFET located between the storage capacitor and a bit line assigned to the cell, with its gate being used for the cell selection terminal.

The semiconductor device CHIP has a rectangular top profile as shown. The memory mats MAT1–MAT8 and MAT17–MAT24 of the memory banks Bank0 and Bank2 (will also be called the first memory mat row) are aligned along one longer side of the chip, and the remaining mats MAT9–MAT16 and MAT25–MAT32 of the memory banks Bank1 and Bank3 (will also be called second memory mat row) are aligned along another longer side of the chip.

On the side nearer to the chip center of the first memory mat row, there are data input/output circuits INT1–INT8 and INT17–INT24 disposed in one-to-one correspondence to the memory mats MAT1–MAT8 and MAT17–MAT24, and on the side nearer to the chip center of the second memory mat row, there are data input/output circuits INT9–INT16 and INT25–INT32 disposed in one-to-one correspondence to the memory mats MAT9–MAT16 and MAT25–MAT32.

In the central section of the chip between the first and second memory mat rows, there are disposed data terminals DQO–DQ15 and global data lines GIOO–GI31 which connect the input/output circuits to the data terminals DQO–DQ15. Further disposed in the chip central section are various control circuits and a voltage generation circuit, and address input terminals, clock signal terminals, control signal terminals and power supply terminals (not shown in FIG. 1, but shown in FIG. 2 and FIG. 3) all aligned along the longitudinal direction of the chip.

The layout of data terminals DQO–DQ15 of the semiconductor device of this embodiment enables the reduction of the length of data transfer route between the memory arrays and data terminals, and enables fast device operation. The alignment of terminals in the longitudinal central area makes the semiconductor chip adaptive to the LOC (lead on chip) packaging scheme.

The global data lines GIOO–GI31 are shown in FIG. 1 as bold lines grouped appropriately for simplicity of purpose. Specifically, the global data lines GIOO–GIO7, GI08–GI15, GI16–GI23, and GI24–GI31 are line groups each including eight lines. Each global data line, e.g., GIOO, is actually provided as a pair of lines for a reason to be explained later. Accordingly, a unit of global data lines is made up of a pair of lines on the semiconductor chip, and it corresponds to a unit of data.

Although in FIG. 1 the global data lines GIOO–GI31 are laid in the central section between a row of input/output circuits INT1–INT8 and INT17–INT24 and another row of input/output circuits INT9–INT16 and INT25–INT32, these lines may be laid in extended areas of the input/output circuits or expanded areas of the element forming areas for the input/output circuits so that the global data lines are merged into the input/output circuits. This merged layout of the global data lines in the input/output circuits is significant in terms of the reduction of the length of the signal route between the input/output circuits and global data lines and of the reduction of the chip size.

In a broader sense, the global data lines are conceived to be data lines common to all memory banks Bank0–Bank3, instead of data lines dedicated to these individual memory banks.

In a narrower sense, the global data lines are conceived to be hierarchical data lines. This embodiment employs 4-level hierarchical data lines, for example, of which those shown in FIG. 1 are data lines of the fourth level, with other data lines of the first through third levels being included within the memory arrays.

Data lines of each hierarchical level are pairs of lines so that complementary data can be transferred, although no limitation is imposed on the invention in this regard. In exchange for an increased number of data lines, transfer of complementary data through data line pairs, in which data is evaluated in terms of the relative signal level on a data line pair, is advantageous in gaining the legibility of signal levels in the presence of some voltage fluctuation, the immunity to power noises and coupling noises caused by the power lines and other signal lines, and the potential capability for the lowering of the signal level, power voltage, power consumption, etc., which are all beneficial to the fast signal transfer and enhanced reliability of the semiconductor device. Hierarchical data lines are line pairs in the following description.

Data lines of level 1 are data line pairs included in the memory mats. Data lines of level 2 are local data line pairs smaller in number than the level-1 data lines, and are connected selectively to data line pairs through a first selection circuit such as a column switching circuit. Data lines of level 3 are main data line pairs which are connected to the local data line pairs through a second selection circuit such as a switching circuit provided commonly to the local data line pairs.

These level-1, level-2 and level-3 data lines are data lines included in the memory cell matrixes. These data line pairs and main data line pairs are laid to run generally in a first direction on the chip in accordance with the hierarchical data line structure and the layout on the chip. The local data line pairs and global data line pairs are laid to run generally in a second direction which is orthogonal to the first direction.

The main data line pairs are set up in one-to-one correspondence to the memory mats or memory arrays. These line pairs are not shown in FIG. 1. Accordingly, the semiconductor device of FIG. 1 has main data line pairs (not shown) which correspond to the memory mats or memory arrays.

Data lines of level 4 are provided commonly to the main data line pairs, and these data lines are the global data line pairs which are connected to the main data line pairs through the input/output circuits INT1–INT32.

It should be noted that in the following description, the terms: local data line pair, main data line pair and global data line pair may be substituted by terms: local I/O line pair, main I/O line pair and global I/O line pair, respectively, where I/O signifies input/output. However, I/O lines not only signify bidirectional lines for input and output, but, in accordance with the operation mode, can be set as unidirectional lines for transferring only input data or output data.

In FIG. 1, the global data lines are laid to run along a somewhat intricate route on the semiconductor chip.

Specifically, a group of global data lines GIO0–GIO7 (will be called the first global data line group or more simply the first group) consists of a first section which runs close to the input/output circuits INT10–INT12, a second section which runs close to the input/output circuits INT5–INT8 and INT17–INT20, and a third section which runs close to the input/output-circuits INT29–INT32.

The first and second sections of the first group are joined through a cross section located in the area of the peripheral circuits of memory including the control circuit, voltage generation circuit and buffer circuit in the central section of the chip. The second and third sections are joined in the same fashion across the central section of the chip.

Other groups of global data lines GI08–GI15 (second group), GI16–GI23 (third group), and GI24–GI31 (fourth group) also have first, second and third sections, and these sections of each group are connected across the central section of the chip.

The layout route of these global data lines is effective for the achievement of the SDR and DDR modes of the SDRAM while suppressing the number signal lines and the line layout area on the chip, as will be more fully appreciated from the following explanation.

The semiconductor device CHIP of this embodiment is determined to be a SDR-spec SDRAM or DDR-spec SDRAM by a mode signal MODE produced by a mode signal generation circuit (or mode selector) 68-1 which will be explained in connection with FIG. 2 and FIG. 3.

Figure 2:
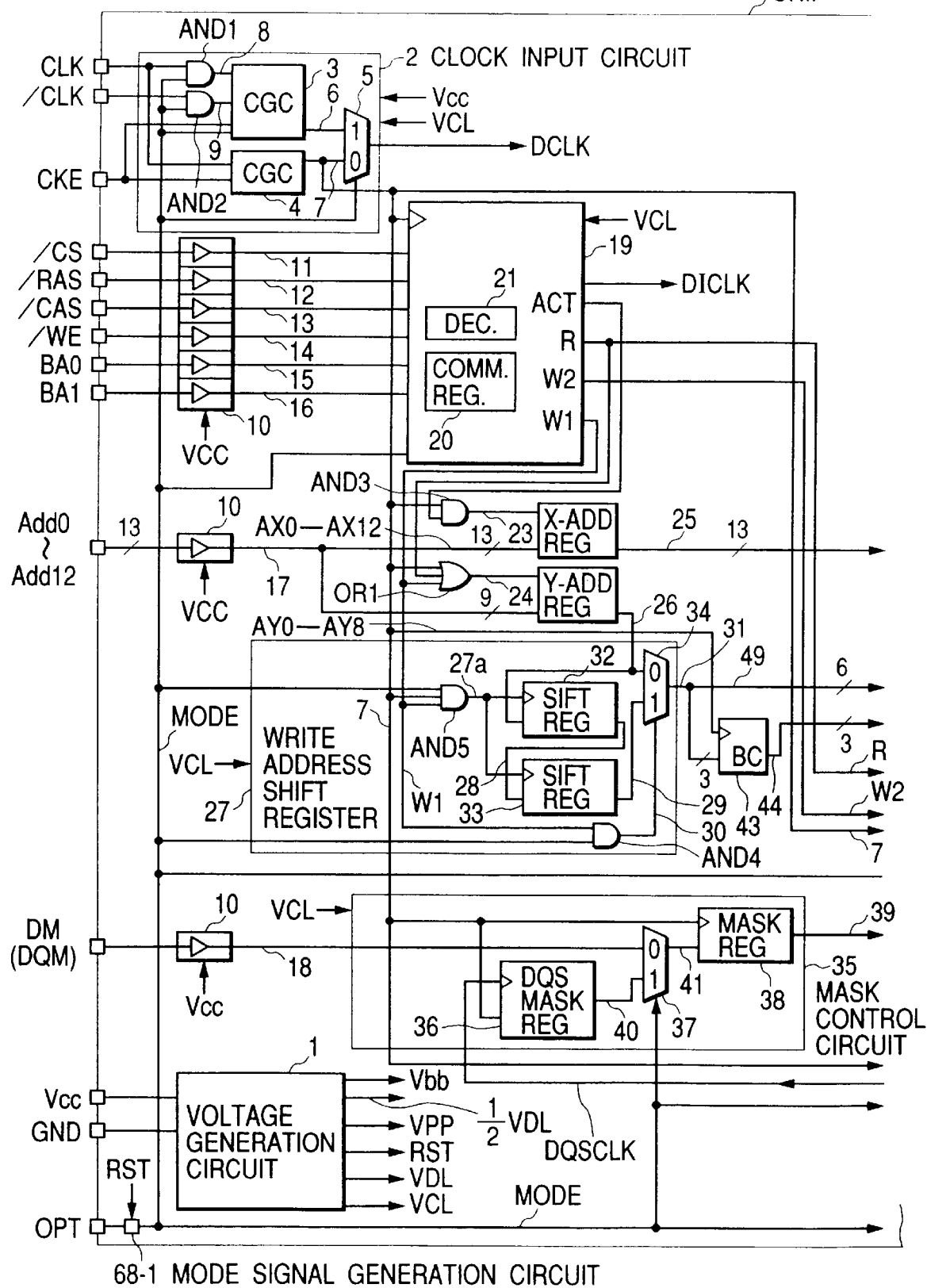
FIG. 2 and FIG. 3 are a set of block diagrams showing in more detail the semiconductor device.
Figure 3:
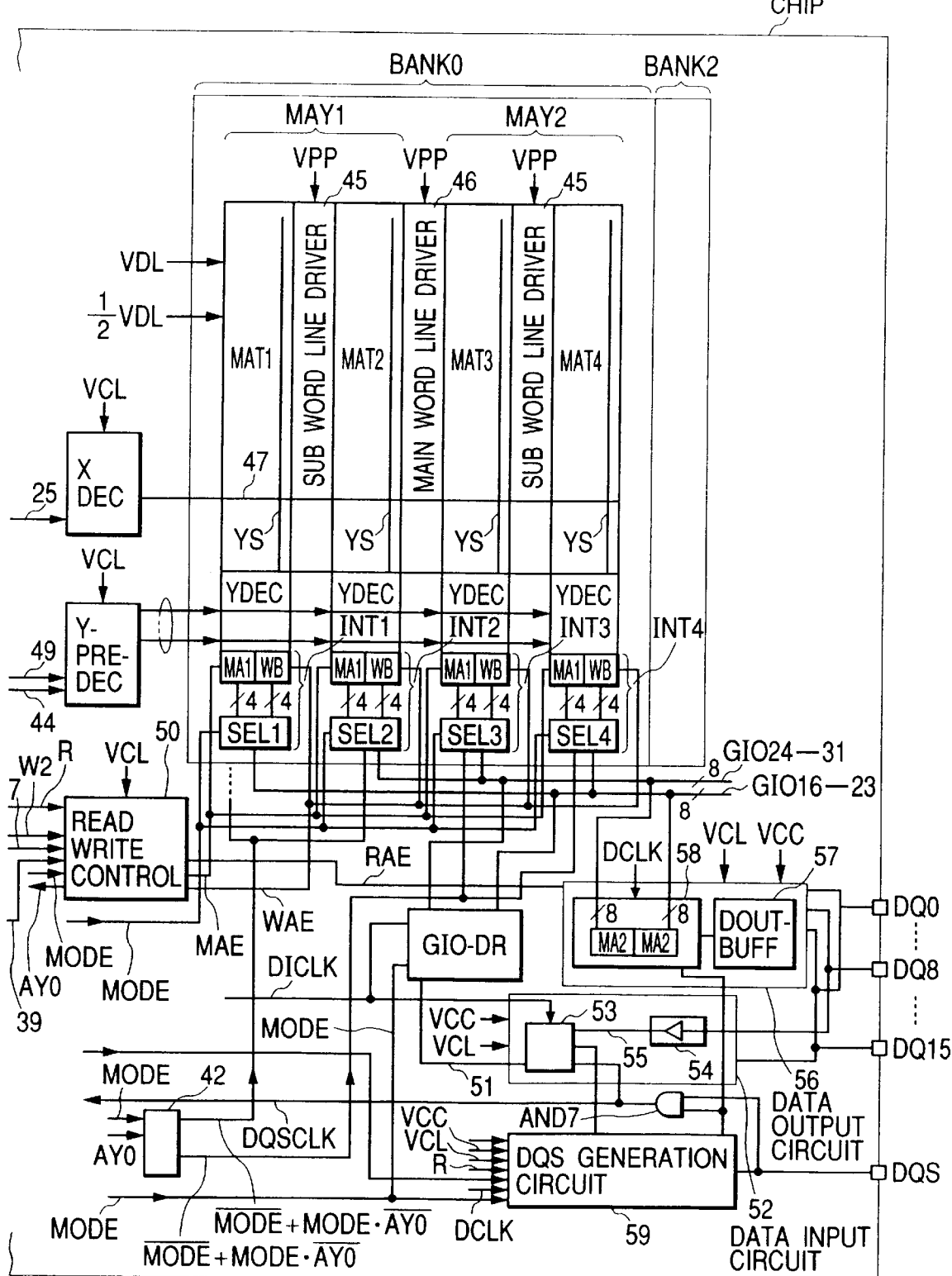

FIG. 2 and FIG. 3 are a set of block diagrams, which when combined, show the details of the semiconductor device of this embodiment of invention.

The semiconductor device CHIP has various terminals including: a clock terminal CLK for receiving an external clock signal CLK, an inverted clock terminal /CLK for receiving an inverted clock signal /CLK which is the logically inverted version of CLK, a clock enable terminal CKE for receiving a clock enable signal CKE, a chip select terminal ICS for receiving a chip select signal ICS, a terminal /RAS for receiving a row address strobe command /RAS, a terminal /CAS for receiving a column address strobe command /CAS, a terminal /WE for receiving a write enable command signal /WE, terminals BA0 and BA1 for receiving a bank select signal BA0–BAI, address terminals Add0–Add12 for receiving an address signal Add0–Add12, a terminal DM (or DQM) for receiving a data mask signal DM (or DQM), a terminal VCC for receiving a power voltage VCC, a terminal GND for receiving a reference ground voltage, an option terminal OPT for receiving an option signal OPT, terminals DQ0–DQ15 for supplying data DQ0–DQ15 into the semiconductor device CHIP or delivering data DQ0–DQ15 out of the device CHIP, and a terminal DQS for receiving a data input timing signal DQS.

These terminals are given the same names or reference symbols as of the signals passing through them for the simplicity of description.

The semiconductor device CHIP operates when supplied with an external power voltage, such as 3.3±0.3 volts, between the power terminal VCC and ground terminal GND. The power voltage VCC of 3.3±0.3 volts is a typical example, and a lower power voltage such as 2.5±0.25 volts may be adopted when necessary.

The signal levels conform to the known SSTL3 standard for the signals which pass through the clock terminal CLK, inverted clock terminal /CLK, clock enable signal terminal CKE, chip select signal terminal ICS, /RAS and /CAS terminals, write enable command signal terminal /WE, bank select signal terminals BA0 and BAI, address terminals Add0–Add12, data mask signal terminal DM (or DQM), data terminals DQ0–DQI5, and DQS terminal, although no limitation is imposed on the invention in this regard. Specifically, with respect to a reference voltage Vref of 1.45 volts, a high-level threshold voltage is defined to be 1.65 volts which is Vref+0.2 volt, and a low-level threshold voltage is defined to be 1.25 volts which is Vref−0.2 volt.

This SSTL3 standard of signal levels is a typical example, and another standard such as the SSTL2 standard may be adopted when necessary. The SSTL2 standard based on a reference voltage Vref of 1.2 volts defines a high-level threshold voltage to be 1.38 volts which is Vref+0.18 volt and a low-level threshold voltage to be 1.02 volts which is Vref−0.18 volt.

Next, the circuit blocks shown in FIG. 2 and FIG. 3 will be explained.

(Voltage Generation Circuit 1)

The voltage generation circuit 1 operates when supplied with the power voltage VCC between the external terminals VCC and GND to produce various voltages and a reset signal used for the operation of all circuit blocks. The generation and usage of the voltages are not a matter of direct concern to the present invention, and an example will merely be presented in the following.

The voltage generation circuit 1 produces from the externally supplied power voltage VCC a negative voltage Vbb, a stepped-up voltage Vpp, a stepped-down voltages VDL and VCL, a plate voltage VDL/2, and a reset signal RST.

The negative voltage Vbb, which is typically −1 volt, is applied to semiconductor regions such as p-type well regions (not shown) used for the gates of the MOSFETs of the memory cells. The negative voltage Vbb is produced by a voltage converting circuit (not shown) which is included in the voltage generation circuit 1 and is made up mainly of an oscillation circuit, a charge pump circuit and a rectifying circuit. This voltage stabilizes the threshold voltage and reduces the leakage current of the memory cell selecting MOSFETS.

The stepped-up voltage Vpp, which is typically +3.5 volts, is applied to selected word lines for driving the memory cell selecting MOSFETs to a deep conduction state. This voltage is produced by a voltage converting circuit similar to that for Vbb.

The stepped-down voltages VDL and VCL, which are typically 1.6 and 2.5 volts, respectively, are used for the operation voltages of the sense amplifiers and logic circuits such as decoders. These voltages are produced by voltage regulators or voltage clamp circuits (not shown) incorporated in the voltage generation circuit 1.

The plate voltage VDL/2 is typically 0.8 volt, i.e., a mid voltage between the high-level and low-level threshold voltages of data signals applied to storage capacitors of memory cells by way of sense amplifiers and bit lines, and it is applied to the common plate electrode (not shown) of storage capacitors of memory cells in the memory mats. This limited plate voltage lowers the voltage which is applied to the dielectric film of storage capacitors, thereby allowing a thinner dielectric film and enabling an increased storage capacity per unit area.

(Clock Input Circuit 2)

The clock input circuit 2 includes logic AND gates AND1 and AND2, a clock regenerating circuit (or clock signal generation circuit or clock signal output circuit) (CGC) 3, and a clock generation circuit (or clock signal generation circuit or clock signal output circuit) (CGC) 4. The circuit 2 receives the clock signal CLK, inverted clock signal /CLK and clock enable signal CKE through the external terminals to produce an internal clock signal DCLK.

The AND gate AND1 receives the MODE signal as a gate control signal from the mode signal generation circuit 68 and functions to gate the clock signal CLK. Specifically, the AND gate AND1 responds to a high-level MODE signal to release a clock signal 8, which is virtually in-phase with the input clock signal CLK, to the clock regenerating circuit 3, and responds to a low-level MODE signal to release a low-level signal 8 regardless of the clock signal CLK. The AND gate AND1 operates when supplied with the power voltage VCC, although no limitation is imposed on the invention in this regard.

Similarly, the AND gate AND2 receives the MODE signal as a gate control signal and functions to gate the inverted clock signal /CLK. Specifically, the AND gate AND2 responds to a high-level MODE signal to release a clock signal 9, which is virtually in-phase with the input inverted clock signal /CLK, to the clock regenerating circuit 3, and responds to a low-level MODE signal to release a low-level signal 9 regardless of the inverted clock signal /CLK. The AND gate AND2 is also supplied with the power voltage VCC.

The clock regenerating circuit 3 is adapted to produce an internal clock signal which is timed appropriately to the external clock signals CLK and /CLK thereby to offset the signal propagation delay of the internal circuits. The AND gates AND1 and AND2 and a selector 5 (explained shortly) located on the path from the external clock signal terminals CLK and /CLK to the output node of internal clock signal DCLK have substantial signal propagation delay characteristics. If there is only a lag-phase internal clock signal available due to the signal propagation delay characteristics of the circuit, a fast device operation of cannot be expected. This limitation of the operation speed is more serious in the DDR mode in which the faster circuit operation is required.

For coping with this matter, the clock regenerating circuit 3 is designed to produce an internal clock signal by compensating the signal propagation delay characteristics of the internal circuits. In consequence, it becomes possible for the output buffer 57 (Dout-Buff) (explained later) or the like to release data signals which are surely in-phase with the clock signal CLK.

The clock regenerating circuit 3 operates to produce an internal clock signal, with the signal propagation delay of the internal circuits being compensated, based on the replica circuit scheme and phase synchronization (or PLL) scheme. The clock regenerating circuit 3 includes a replica circuit which produces a clock signal which lags from the clock signal 6 by delay time across the route from the external clock terminal CLK to the output of the AND gate AND1 or AND2 plus the delay time of the output buffer 57. The replica circuit has its output, i.e., a replica clock signal, made in-phase with the external clock signal CLK, so that the input signal of the replica circuit (internal clock signal 6) has a leading phase, which is equal to the above-mentioned total delay time, relative to the external clock signal CLK.

In consequence, the output buffer (Dout-Buff) 57 which operates based on the internal clock signal 6 releases output data which is exactly in-phase with the external clock signal CLK regardless of the signal propagation delay characteristics of the internal circuits.

The replica circuit has its delay time set equal to one period of the external clock signal CLK reduced by the above-mentioned total delay time. Alternatively, the delay time of the replica circuit may be equal to a multiple of one period of the external clock signal CLK reduced by the above-mentioned total delay time.

The clock regenerating circuit 3 is designed to operate when supplied with the relatively stable stepped-down voltage VCL produced by the voltage generation circuit 1, although no limitation is imposed on the invention in this regard.

In case the semiconductor device CHIP configures a SDR-spec SDRAM in response to a low-level MODE signal, the clock regenerating circuit 3 is deactivated so that it consumes less power. Specifically, in case the MODE signal is turned low so that the SDRAM operates in the SDR mode, the AND gates AND1 and AND2 have their clock outputs 8 and 9 fixed to the low level and, at the same time, a power switching MOS transistor located between the internal power supply VCL and the source of a PMOS transistor in the circuit 3 is cut off so that the voltage VCL is not supplied to the source of the PMOS transistor. Consequently, the amount of power which would be consumed by the clock regenerating circuit 3 when it operates to release the output signal 6 for the internal clock signal DCLK can be saved.

As an alternative scheme f or the case of an SDR-spec SDRAM set by a low-level MODE signal, the AND gates AND1 and AND2 have their clock outputs 8 and 9 fixed to the low level, but the circuit 3 is not equipped with a power switching MOS transistor between the internal power supply VCL and the source of the PMOS transistor, leaving the power voltage VCL supplied to the source of the PMOS transistor. The clock regenerating circuit 3 is inert in its operation and releases a fixed-level clock signal 6 due to the low-level clock inputs 8 and 9, and consequently the power consumption is reduced as compared with the operation with the normal input of clock signals 8 and 9.

In another case where the semiconductor device CHIP configures a DDR-spec SDRAM in response to a high-level MODE signal, the clock regenerating circuit 3 is activated accordingly.

The clock regenerating circuit 3 can also be arranged by using a DDL (delayed lock loop) circuit, SMD (synchronous mirror delay) circuit, or their combination in place of the above-mentioned PLL (phase-locked loop) circuit. These PLL, DDL and SMD circuits are known in the art, and so further explanation thereof will be omitted.

The clock generation circuit 4 operates by receiving the clock signal CLK and clock enable signal CKE. Specifically, the circuit 4 releases a clock signal 7 which is in-phase with the external clock signal CLK in response to a high-level clock enable signal CKE, or it releases a low-level signal 7 regardless of the clock signal CLK in response to a low-level clock enable signal CKE. A specific circuit arrangement of the clock generation circuit 4 will be explained later in connection with FIG. 19.

Figure 14:
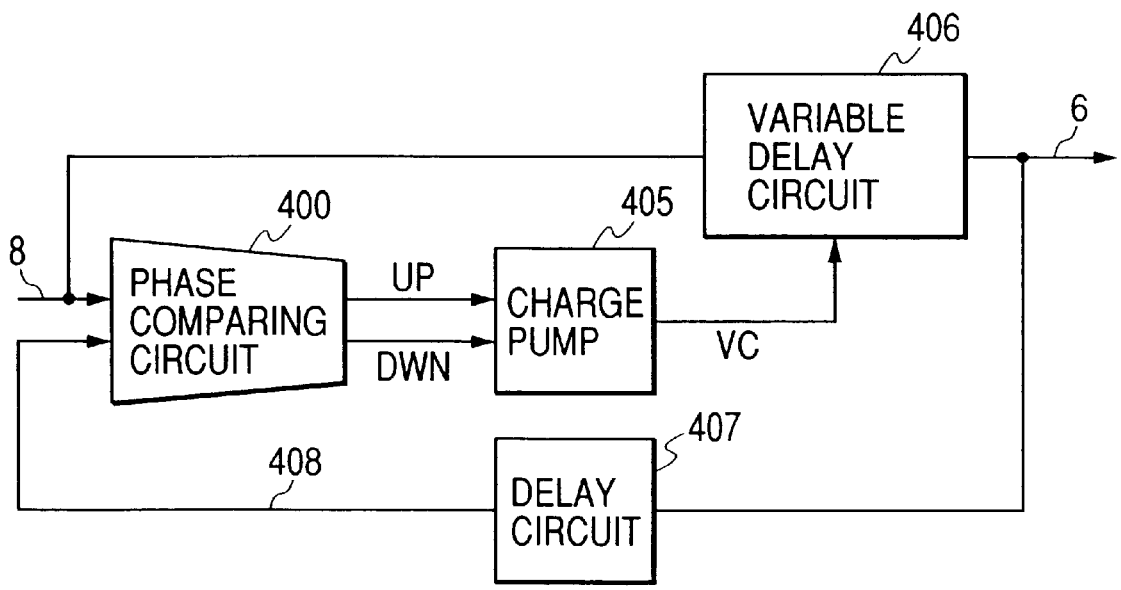
FIG. 14 is a block diagram of the DLL circuit.

FIG. 14 shows the circuit arrangement of the clock generation circuit 3 which is based on PLL operation. The PLL circuit includes a phase comparing circuit 400, a charge pump circuit 401, a voltage-controlled oscillation circuit 403, and a delay circuit 402 which functions as the above-mentioned replica circuit.

The phase comparing circuit 400 has its one input supplied with the clock signal 8 provided by the AND gate AND1 in FIG. 2 and another input supplied through the delay circuit 402 with the clock signal 6 provided by the voltage-controlled oscillation circuit 403. The circuit 400 compares the phases of the clock signal 8 and the delayed version of the clock signal 6, i.e., the output signal 408 of the delay circuit 402, thereby to produce signals UP and DWN depending on the phase difference. The UP and DOWN signals produced by the phase comparing circuit 400 are fed to the charge pump circuit 401.

The charge pump circuit 401 incorporates a capacitor C (not shown), which is charged at a rate proportional to the pulse width (phase difference) of the UP signal and is discharged in proportion to the pulse width (phase difference) of the DOWN signal. The voltage appearing across the capacitor C becomes a control voltage VC. Accordingly, the charge pump circuit 401 behaves as a loop filter which integrates the UP signal and DOWN signal and releases a d.c. voltage signal.

Figure 17:
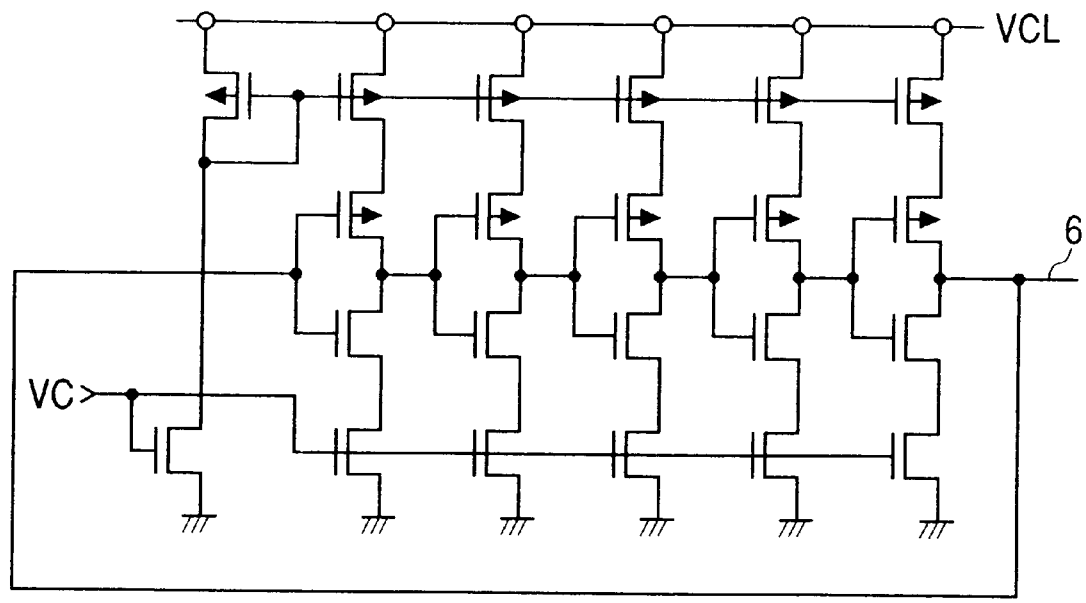
FIG. 17 is a schematic diagram of the voltage-controlled oscillation circuit used in the PLL circuit.

The voltage-controlled oscillation circuit 403 is an oscillation circuit having its oscillation frequency controlled by the control voltage VC. FIG. 17 shows a specific circuit arrangement of the voltage-controlled oscillation circuit 403.

In FIG. 17, the voltage-controlled oscillation circuit 403 is a ring oscillator made up of five logic inverters connected in series in a loop. Each inverter includes a MOSFET having its conductance varied by the control voltage VC, so that its delay time varies in accordance with the control voltage VC. The voltage-controlled oscillation circuit 403 of FIG. 17 oscillates at a frequency which is inversely proportional to the control voltage VC.

Figure 13:
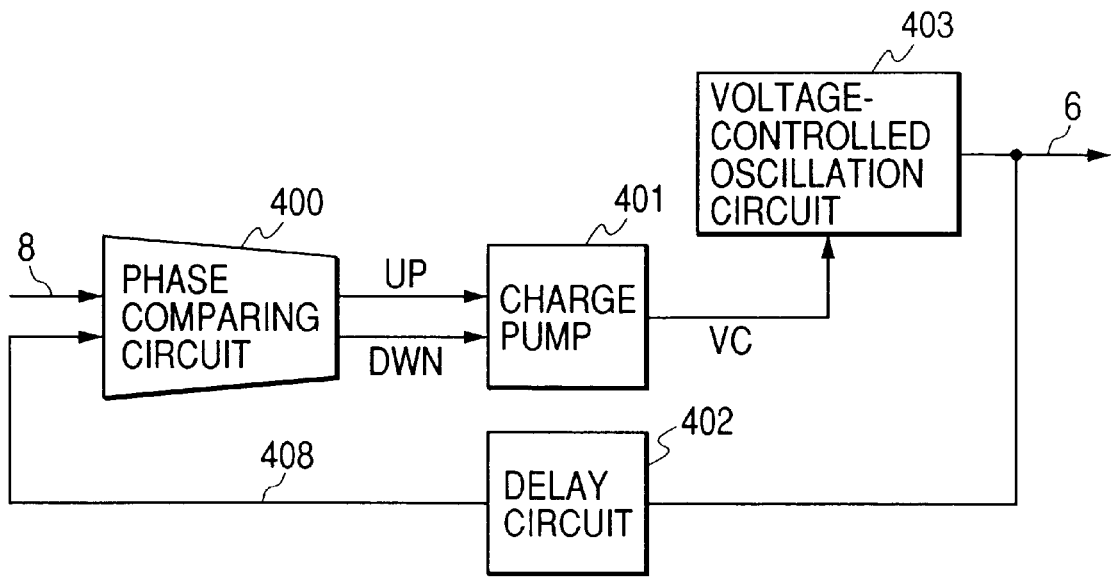
FIG. 13 is a block diagram of the PLL circuit.

In FIG. 13, if the output signal 408 of the delay circuit 402 lags in phase (or is lower in frequency) relative to the clock signal 8, the phase comparing circuit 400 produces an UP signal which reflects any phase difference, causing the charge pump circuit 401 to raise the control voltage VC. Consequently, the inverters which constitute the ring oscillator shown in FIG. 17 have their delay time decreased, resulting in a raised frequency of the voltage-controlled oscillation circuit 403, and the output signal of the delay circuit 402 advances in phase (rises in frequency). Based on this feedback operation, the output signal 408 of the delay circuit 402 is synchronized with the clock signal 8, and the clock signal 6 is also synchronized with the clock signal 8.

If, otherwise, the output signal 408 of the delay circuit 402 leads in phase (or is higher in frequency) relative to the clock signal 8, the phase comparing circuit 400 produces a DOWN signal which reflects their phase difference, causing the charge pump circuit 401 to lower the control voltage VC. Consequently, the inverters of the ring oscillator have their delay time increased, resulting in a lowered frequency of the voltage-controlled oscillation circuit 403, and the output signal of the delay circuit 402 lags in phase (falls in frequency). Based on this feedback operation, the output signal 408 of the delay circuit 402 is synchronized with the clock signal 8, and the clock signal 6 is also synchronized with the clock signal 8.

The delay circuit (replica circuit) 402 is designed to have a delay time which is equal to one period of the clock signal CLK reduced by the sum of the delay time of the data output circuit 56 including the output buffer 57, the delay time of the AND gate AND1 or AND2, the delay time across the route from the clock terminal CLK to the AND gate AND1 or from the clock terminal /CLK to the AND gate AND2, and the delay time of the clock signal DCLK across the route from the clock input circuit 2 to the data output circuit 56. The delay time for replica may be altered when necessary. For example, in case the above-mentioned total delay time is longer than the period of the clock signal CLK, the replica circuit is set to have a delay time which is equal to a multiple of one period of the clock signal CLK reduced by the above-mentioned total delay time.

Figure 18:
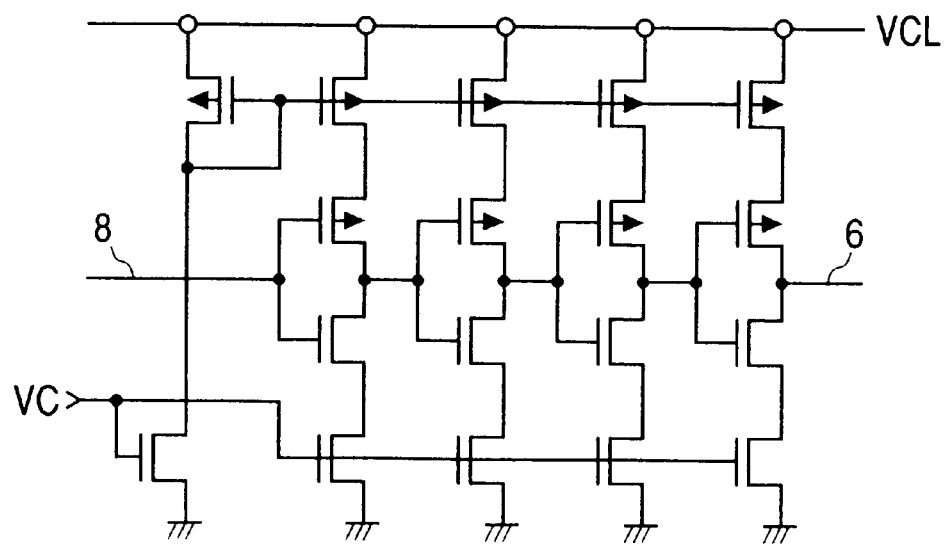
FIG. 18 is a schematic diagram of the variable delay circuit used in the DLL circuit.

FIG. 14 shows the circuit arrangement of the clock regenerating circuit 3 which is based on DLL operation in place of PLL. The DLL circuit includes a phase comparing circuit 404, a charge pump circuit 405, a variable delay circuit 406, and a delay circuit (replica circuit) 407. FIG. 18 shows a specific circuit arrangement of the variable delay circuit 406. The circuit 406 is made up of four logic inverters connected in series in a loop, with each inverter having its delay time varied by the control voltage VC. The delay time of the variable delay circuit 406 is inversely proportional to the control voltage VC.

In operation, if the output signal 408 of the delay circuit 407 lags in phase (or is lower in frequency) relative to the clock signal 8, the phase comparing circuit 404 produces an UP signal which reflects any phase difference, causing the charge pump circuit 405 to raise the control voltage VC. Consequently, the variable delay circuit 406 has its delay time decreased, resulting in a leading phase (rising frequency) of the delay circuit output signal 408. Based on this feedback operation, the output signal 408 of the delay circuit 407 is synchronized with the clock signal 8, and the clock signal 6 is also synchronized with the clock signal 8.

If, otherwise, the output signal 408 of the delay circuit 407 leads in phase (or is higher in frequency) relative to the clock signal 8, the phase comparing circuit 404 produces a DOWN signal which reflects any phase difference, causing the charge pump circuit 405 to lower the control voltage VC. Consequently, the variable delay circuit 406 has its delay time increased, resulting in a lagging phase (falling frequency) of the delay circuit output signal 408. Based on this feedback operation, the output signal 408 of the delay circuit 407 is synchronized with the clock signal 8, and the clock signal 6 is also synchronized with the clock signal 8.

Similar to the delay circuit 402 of FIG. 13, the delay circuit (replica circuit) 407 is designed to have a delay time which is equal to one period of the clock signal CLK reduced by the sum of the delay time of the data output circuit 56 including the output buffer 57, the delay time of the AND gate AND1 or AND2, the delay time across the route from the clock terminal CLK to the AND gate AND1 or from the clock terminal /CLK to the AND gate AND2, and the delay time of the clock signal DCLK across the route from the clock input circuit 2 to the data output circuit 56. In case the above-mentioned total delay time is longer than the period of the clock signal CLK, the replica circuit is set to have a delay time which is equal to a multiple of one period of the clock signal CLK reduced by the above-mentioned total delay time.

Figure 15:
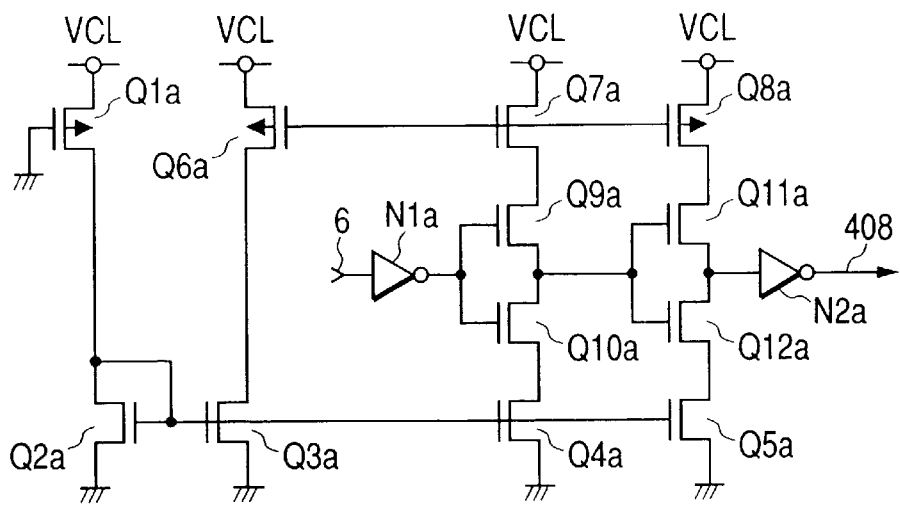
FIG. 15 is a schematic diagram of the delay circuit used in the PLL circuit and DLL circuit.

FIG. 15 shows a specific circuit arrangement of the delay circuit (replica circuit) 402 or 407 included in the PLL circuit of FIG. 13 and the DLL circuit of FIG. 14.

In the figure, a p-channel MISFET (metal insulation semiconductor field effect transistor) Q1a having its gate pulled fixedly to the ground voltage conducts a current, which is caused to flow to an n-channel MISFET Q2a in diode configuration. There are n-channel MISFETs Q4a and Q5a which are in current-mirror connection with the MISFET Q2a. The to MISFETs Q4a and Q5a are connected in series to n-channel MISFETs Q10a and Q12a, respectively, which form a CMOS inverter circuit. MISFETs will also be called MIS transistors in the following description.

The current produced by the MIS transistor Q1a is caused to flow by way of an n-channel MIS transistor Q3a in current-mirror connection with the MIS transistor Q2a to a p-channel MIS transistor Q6a. There are p-channel MISFETs Q7a and Q8a which are in current-mirror connection with the MISFET Q6a. The MISFETs Q7a and Q8a are connected in series to p-channel MISFETs Q9a and Q11a, respectively, which form a CMOS inverter circuit.

The two CMOS inverter circuits formed by the p-channel MIS transistors Q9a and 11a and n-channel MIS transistors Q10a and Q12a produce an output current which corresponds with the current produced by the MIS transistor Q1a, and the output current determines a signal delay time. In this embodiment, the clock signal 6 is fed through a logic inverter N1a to the CMOS inverter transistors Q9a and Q10a of the input stage, and the output signal of the CMOS inverter transistors Q11a and Q12a of the output stage is delivered as the clock signal 408 through a logic inverter N2a.

Figure 16:
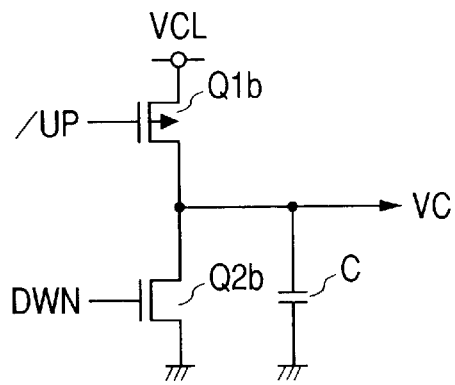
FIG. 16 is a schematic diagram of the charge pump circuit used in the PLL circuit and DLL circuit.

FIG. 16 shows a specific circuit arrangement of the charge pump circuit 401 or 405 included in the PLL circuit of FIG. 13 and the DLL circuit of FIG. 14. It is made up of a p-channel MIS transistor Q1b which receives the UP signal, an n-channel MIS transistor Q2b which receives the DOWN signal, and a capacitor C which is charged and discharged through the MIS transistors Q1b and Q2b.

The phase comparing circuits 400 and 404 included in the PLL circuit and DLL circuit have conventional circuit arrangements, and so explanation of their operations will be omitted.

Figure 19:
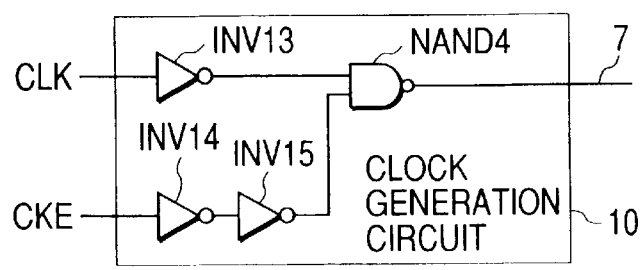
FIG. 19 is a schematic diagram of the clock generation circuit.

FIG. 19 shows a specific circuit arrangement of the clock generation circuit 4. It is made up of logic inverters INV1–INV15 and a NAND gate NAND4.

The inverter INV13 receives the clock signal CLK and releases the inverted version of CLK to one input of the NAND gate NAND4. The inverter INV14 receives the signal CKE and releases the inverted version of CKE to the input of the inverter INV15, which releases the inverted version of its input signal to another input of the NAND gate NAND4. The NAND gate NAND4 takes the logical NAND product of the two input signals to produce a clock signal 7. Namely, the NAND gate NAND4 responds to a high-level CKE signal to release the clock signal 7 which lags from the clock signal CLK by the total delay time of the inverter INVI3 and itself. Otherwise, when the CKE signal is low, the NAND gate NAND4 releases a high-level output invariably. The clock signal 7 produced by the clock generation circuit 10 lags in phase from the clock signal CLK by the total inherent delay time of the inverter INV13 and NAND gate NAND4.

Returning to FIG. 2, the selector 5 receives the MODE signal as selection control signal from the mode signal generation circuit 68 to select the clock signal 6 provided by the clock regenerating circuit 3 or the clock signal 7 provided by the clock generation circuit 4, and releases an internal clock signal DCLK. Specifically, the selector 5 releases the clock signal 7 intact as internal clock signal DCLK in response to a low-level MODE signal, or releases the clock signal 6 intact as DCLK in response to a high-level MODE signal. It operates by being supplied with the stepped-down power voltage VCL.

Accordingly, when the semiconductor device configures an SDR-spec SDRAM, the internal clock signal DCLK is produced from the output signal 7 of the clock generation circuit 4, or when the semiconductor device configures a DDR-spec SDRAM, the internal clock signal DCLK is produced from the output signal 6 of the clock regenerating circuit 3.

The clock input circuit 2 is designed to use both the external clock signal CLK and inverted clock signal /CLK when the semiconductor device configures a DDR-spec SDRAM. The circuit 2 uses only the external clock signal CLK and ignores the inverted clock signal /CLK when the semiconductor device configures a SDR-spec SDRAM.

Alternatively, however, the clock input circuit 2 may use both the external clock signal CLK and inverted clock signal /CLK in both cases of the DDR-spec SDRAM and SDR-spec SDRAM, or the circuit 2 may use only the external clock signal CLK in both cases of the DDR-spec SDRAM and SDR-spec SDRAM. It should be noted that in the latter case, the device will have a smaller margin of legitimacy of CLK clock input as compared with the former case.

(Input Buffers 10)

The semiconductor device CHIP has external input terminals, which include a clock enable terminal CKE, chip select terminal ICS, row address strobe command terminal /RAS, column address strobe command terminal /CAS, write enable command terminal /WE, bank select signal terminals BA0 and BA1, address terminals Add0–Add12, and data mask terminal DM, and has input buffers 10 connected on their inputs to these external input terminals. The input buffers 10 amplify the input signals by being supplied with the external power voltage VCC. Among the amplified output signals 11 through 18 released from the input buffers 10, the signals 11 through 16 are fed to a command state control circuit 19, which will be explained in the following.

(Command State Control Circuit 19)

The Command state control circuit 19, which operates by being supplied with the stepped-down power voltage VCL, incorporates a decoder 21 and a command register 20. The decoder 21 receives the MODE signal, external input signals 11–16 and clock signal 7, and produces an activation signal ACT, a read signal R, write signals W1 and W2, and a clock signal DICLK based on the received signals. The command register 20 is used to hold command information.

The operation of the command state control circuit 19 will be explained later with reference to the timing charts of FIG. 5 through FIG. 8.

(X-system Address Register)

The x-system address register X-AddReg fetches and holds a 13-bit x-system address signal AX0–AX12 in response to a transition from low to high of the input control signal 23 provided by a control gate circuit which is shown as a logic AND gate AND3, and releases an x-system internal address signal 25 which corresponds to the address signal AX0–AX12. The AND gate AND3 produces the input control signal 23 in accordance with the activation signal ACT provided by the command state control circuit 19 and the internal clock signal provided by the clock generation circuit 4 in the clock input circuit 2. The AND gate AND3 and x-system address register X-AddReg operate by being supplied with the stepped-down power voltage VCL.

(Y-system Address Register)

The y-system address register Y-AddReg fetches and holds a 9-bit y-system address signal AY0–AY8 in response to a low-to-high transition of the input control signal 24 provided by a control gate circuit which is shown as a logic OR gate OR1, and releases a y-system internal address signal 26 which corresponds to the address signal AY0–AY8. The OR gate OR1 and y-system address register Y-AddReg operate by being supplied with the stepped-down power voltage VCL.

(Write Address Shift Register 27)

The write address shift register 27 is made up of AND gates AND4 and AND5, shift registers 32 and 33, and a selector 34. The AND gate AND4 receives the MODE signal from the mode signal generation circuit 68 and the write signal W1 from the command state control circuit 19, and releases a control signal 30. The AND gate AND5 receives the clock signal 7 and write signal W1, and releases a control clock signal 27a.

The shift register 32 fetches and holds the y-system address signal 26 in response to a low-to-high transition of the control clock signal 27a, and releases a y-system address signal 28 which corresponds to the signal 26.

The shift register 33 fetches and holds the y-system address signal 28 at the timing of the control clock signal 27a, and releases a y-system address signal 29 which corresponds to the signal 28. More specifically, the y-system address signal 26 is held by the shift register 32 at a low-to-high transition of the control clock signal 27a, and thereafter the y-system address signal 28 is held by the shift register 33 at the next low-to-high transition of the control clock signal 27a. Accordingly, the y-system address signal 26 is delayed by two clock cycles of the control clock signal 27a by the shift registers 32 and 33 to become the y-system address signal 29, which is then fed to the selector 34.

The selector 34 receives the y-system address signals 26 and 29, selects one of these address signals in accordance with the control signal 30, and releases the selected address signal as y-system address signal 31. With the write signal W1 being high for the data writing operation, the selector 34 operates depending on the level of the MODE signal.

Based on this operation of the selector 34, the write address shift register 27 releases the y-system address signal 26 as y-system address signal 31 in response to a low-level MODE signal which specifies the configuration of SDR-spec SDRAM, or otherwise it releases the y-system address signal 29 as y-system address signals 31 in response to a high-level MODE signal which specifies the configuration of DDR-spec SDRAM.

The selector 34 releases the y-system address signal 29 at a timing which is later by two cycles of the clock signal 7 than the timing of release of the y-system address signal 26. The y-system address signals 26 and 29 have the same numeric address value.

The reason for the foregoing control of the y-system address is to optimize the device operation for both cases of the SDR-spec SDRAM and DDR-spec SDRAM which have different timing relations of the write command input and y-system address input. Specifically, in the case of the SDR-spec SDRAM, the y-system address is entered at the same timing or in the same clock cycle as the write command input, whereas in the case of the DDR-spec SDRAM, the y-system address is entered at the next timing or in the next clock cycle after the write command input.

In consequence, the SDR-spec SDRAM begins the decoding of the y-system address signal 31 provided by the write address shift register 27 for the y-system selection (column selection) in the same clock cycle as the entry of the write command, whereas the DDR-spec SDRAM begins the decoding of the y-system address signal 31 for the y-system selection in the next clock cycle after the entry of the write command.

All circuits included in the write address shift register 27 operate by being supplied with the stepped-down power voltage VCL.

(DQS Generation Circuit 59)

The DQS generation circuit 59 receives the external power voltage VCC, stepped-down power voltage VCL, clock signal 7, clock signal DCLK, MODE signal, and read signal R, and produces a data strobe signal DQS based on these voltages and signals.

When the MODE signal is high to configure a DDR-spec SDRAM, the DOS generation circuit 59 produces and delivers to the DQS terminal a data strobe signal DQS which sets the transitions of its level in synchronism with the timing of data output from the data terminals DQ0–DQ15.

The circuit 59 receives a read signal R which is information on the CAS latency and burst length of the data to be output, and produces a data strobe signal DQS which makes a certain number of transitions at a certain timing based on this information.

When the MODE signal is low to configure a SDR-spec SDRAM, the DQS generation circuit 59 has an output of high-impedance state.

The data read-out operation of the DDR-spec SDRAM will be explained in more detail by taking an example of the case where the CAS latency is 2 and the burst length is 4.

On receiving a read signal R having information which specifies a CAS latency of 2 and a burst length of 4, the DQS generation circuit 59 produces a data strobe signal DQS as follows.

The data strobe signal DQS turns from the high-impedance state to the low level and retains the low level for at least a ¾ period of the clock signal CLK. The transition from the high-impedance state to the low level is timed to the rising edge of the clock signal 7 which sets the transition at the rising edge of the clock signal CLK after one (CAS latency subtracted by 1) CLK period following the rising edge of CLK at which the circuit has received the read command.

Subsequently, the data strobe signal DQS sets four consecutive transitions for the burst in synchronism with the clock signal DCLK. Synchronization with DCLK is intended to synchronize, the output of DQS with the timing of data output to the terminals DQ0–DQ15 by the data output circuits 56 which takes place in synchronism with DCLK. The data strobe signal DQS sets the first low-to-high transition at the rising edge of the clock signal DCLK which makes the transition at the rising edge of the clock signal CLK after two ((CAS latency) CLK periods following the rising edge of CLK at which the circuit has received the read command.

The DQS generation circuit 59 includes an output buffer (not shown) for the data strobe signal DQS, which has a level shift function and operates by being supplied with the external power voltage VCC. Other circuits (not shown) which constitute the DQS generation circuit 59 in unison operate by being supplied with the stepped-down power voltage VCL.

(Logic Circuit 42)

The logic circuit 42, which functions to control the switching of the global data lines in correspondence to the SDR mode and DDR mode, receives the MODE signal and address bit AY0 out of the y-system address signal, and produces control signals /MODE+MODE*AY0 and /MODE+MODE*/AY0. The control signal /MODE+MODE*AY0 results from the logical product of the MODE signal and the address bit AY0, and the logical sum of the result and the inverted MODE signal. The control signal /MODE+MODE*/AY0 results from the logical product of the MODE signal and the inverted address bit AY0, and the logical sum of that result and the inverted MODE signal.

The output control signal from the logic circuit 42 and global data line switching control will be explained in more detail in connection with FIG. 4.

(Burst Counter BC)

The burst counter BC, which functions to control the burst transfer of SDRAM data, receives three address bits 43 out of the 9-bit y-system address signal 31 provided by the write address shift register 27 so that this address value is preset to it, and counts up, i.e., adds 1 to the contents having an initial value of address bit 43, in response to the low-to-high transition of the clock signal 7.

(Memory Banks)

Among the four memory banks Bank0–Bank3 of the semiconductor device shown in FIG. 1, only two memory banks Bank0 and Bank2 are shown in FIG. 3 for the simplicity of illustration. Although the memory bank Bank0 has four memory arrays as shown in FIG. 1, only two memory arrays MAY1 and MAY2 are shown in FIG. 3.

The memory array MAY1 has two memory mats MAT1 and MAT2, and the memory array MAY2 also has two memory mats MAT3 and MAT4, as explained previously in connection with FIG. 1.

Each memory array includes word lines WL, data line pairs DL, memory cells MC connected to the word lines and data lines, and sense amplifiers SA connected to the data line pairs (all not shown) as explained previously. The memory cell MC is a dynamic memory cell. The sense amplifier SA amplifies a data signal which has been read out of a memory cell onto the data line pair DL and amplifies a data signal to be stored provided by the data writing circuits. The memory bank has word lines of 8192 (8K) in number, for example.

Further shown in FIG. 3 are sub word line drivers 45 and main word line drivers 46 included in the memory array. The sub word line drivers 45, which drive the word lines, have a function of decoding the signals provided by the main word line drivers 46 by receiving decoded signals 47 from the x-address decoder XDEC, thereby to produce word line select signals.

The sense amplifiers SA are supplied with the stepped-down power voltage VDL, while sub word line drivers 45 and main word line drivers 46 are supplied with the stepped-up voltage Vpp. Accordingly, the sense amplifiers SA release amplified signals having a level of VDL, which are rewritten into selected memory cells. The sub word line drivers 45 produce word line selecting signals having a level of the high power Vpp, so that memory cell selecting MOSFETs are brought to a deep conduction state.

(X-address Decoder)

The x-address decoder XDEC receives a 13-bit x-system address signal 25, and decodes the signal 25 into signals 47. The decoded signals 47 are given to the sub word line drivers 45 and main word line drivers 46. The x-address decoder XDEC, sub word line drivers 45 and main word line drivers 46 operate in unison to select one of 8K word lines mentioned above. The x-address decoder XDEC operates by being supplied with the stepped-down power voltage VCL.

(Y-address Pre-decoder)

The y-address pre-decoder implements the pre-decoding of the y-system address signal, i.e., 6-bit y-system address signal 49 from the write address shift register 27 and 3-bit y-system address signal 44 from the burst counter BC thereby to produce pre-decoded signals 48. The pre-decoded signals 48 are fed to the y-system decoder YDEC. The y-address pre-decoder YDEC operates by being supplied with the stepped-down power voltage VCL.

(Y-address Decoder)

The y-address decoder receives the pre-decoded signals 48 and selects one of y-selection lines YS included in the corresponding memory mats MAT1–MAT4. The y-address decoder operates by being supplied with the stepped-down power voltage VCL.

(Read/write Control Circuit 50)

The read/write control circuit 50 receives the clock signal 7, read control signal R, write control signal W2, y-system address signal AY0 and data mask signal 39, and produces a main amplifier enable signal MAE and write buffer enable signal WAE.

Figure 4:
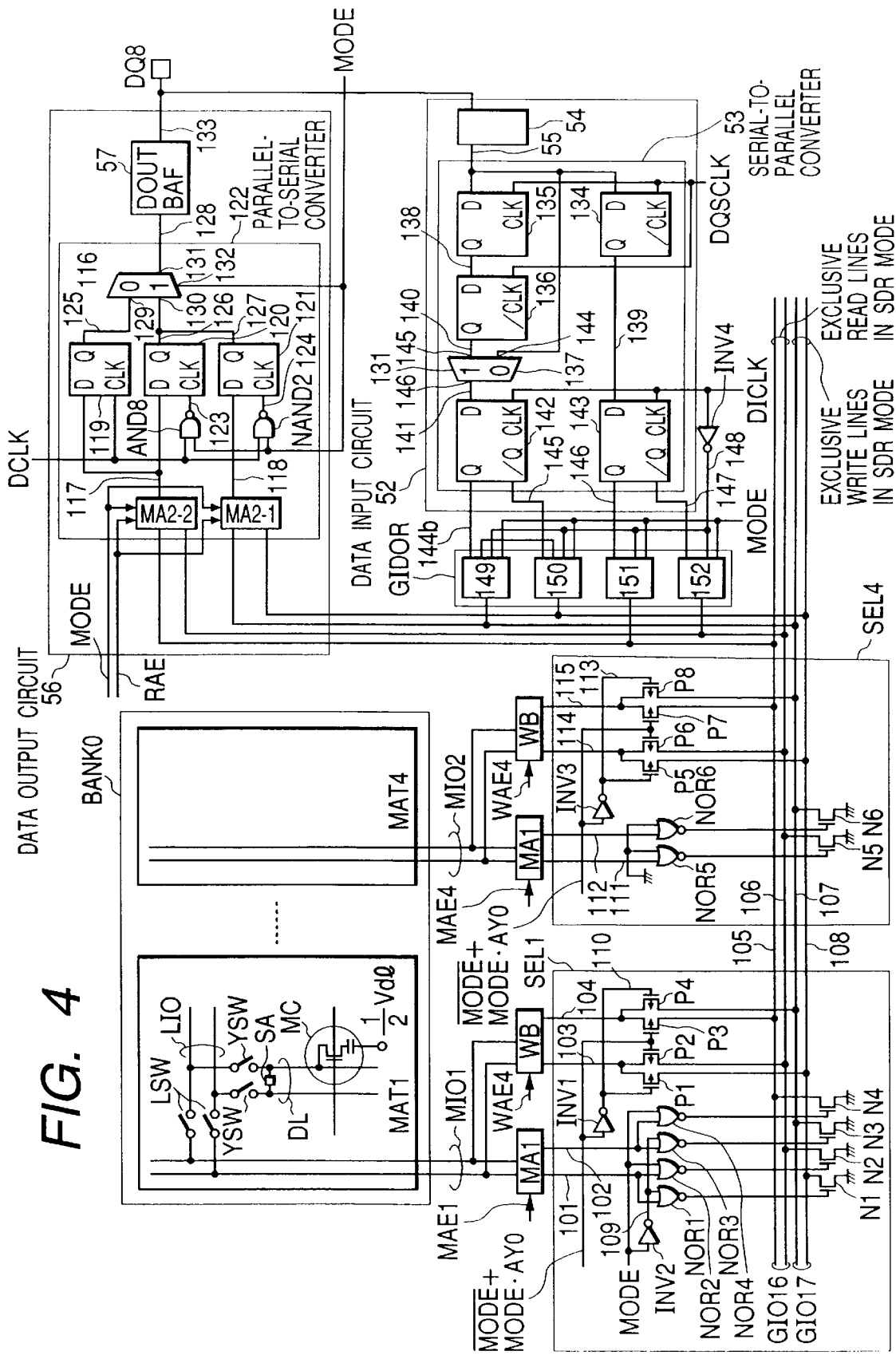
FIG. 4 is a schematic diagram of the circuit blocks shown in FIG. 2 and FIG. 3.

The MAE signal shown in FIG. 4 is actually eight signals MAE1–MAE8 corresponding to eight main amplifiers MA1 provided for the eight memory mats MAT1–MAT8 of the memory bank Bank0, of which only two sets of them are shown in FIG. 4.

The main amplifier enable signals MAE1–MAE8 are controlled by the y-system address bit AY0 and MODE signal specifically, when the MODE signal is high to configure a DDR-spec SDRAM, these signals MAE1–MAE8 are controlled in common regardless of the y-system address bit AY0 in the read-out operation. otherwise, when the MODE signal is low to configure a SDR-spec SDRAM, the signals MAE1, MAE3, MAE5 and MAE7 are controlled in common and the signals MAE2, MAE4, MAE6 and MAE8 are controlled in common in the read-out operation, so that the former signals MAE1–MAE7 and latter signals MAE2–MAE8 are brought in common to the select-state and non-select state, respectively, or brought to the non-select-state and select-state, respectively, depending on the y-system address bit AY0.

The write buffer enable signal WAE shown in FIG. 3 is actually eight signals WAE1–WAE8 corresponding to the eight memory mats MAT1–MAT8 of the memory bank BankO, of which only two sets of them are shown in FIG. 4.

These signals WAE1–WAE8 are controlled by the y-system address bit AY0 and MODE signal. Specifically, when the MODE signal is high to configure a DDR-spec SDRAM, these signals WAE1–WAE8 are controlled in common regardless of the y-system address bit AY0 in the write operation. Otherwise, when the MODE signal is low to configure a SDR-spec SDRAM, the signals WAE1, WAE3, WAE5 and WAE7 are controlled in common and the signals WAE2, WAE4, WAE6 and WAE8 are controlled commonly in the write operation, so that the former signals WAE1–WAE7 and latter signals WAE2–WAE8 are brought in common to the select-state and non-select state, respectively, or brought to the non-select-state and select-state, respectively, depending on the y-system address bit AY0.

The read/write control circuit 50 operates by being supplied with the stepped-down power voltage VCL.

(Input/output Circuits)

FIG. 3 shows four input circuits INT1–INT4 out of the INT1–INT32 shown in FIG. 1. Each input circuit INT includes a main amplifier MA1, a write buffer WB, and a selection circuit SEL. The main amplifier MA1 is activated by the main amplifier enable signal MAE to amplify a data signal coming in over the main data line (not shown) of the associated memory mat and deliver the output signal to the associated selection circuit.

The write buffer WB is activated by the write buffer enable signal WAE to conduct a data signal coming in through the associated selection circuit onto the data line (not shown) of the associated memory mat. The selection circuit SEL is located logically between the main amplifier MAI and write buffer WB and the global data lines.

Accordingly, data read out of a memory mat onto the main data line pair MIO is transferred to the global I/O line pair GIO by way of the main amplifier MAI and selection circuit SEL. Data to be stored coming over the global I/O line pair GIO is transferred to the main data line pair MIO by way of the selection circuit SEL and write buffer WB.

The selection circuits SL1–SL4 are connected to the grouped global data lines mentioned previously, and operate in the SDR mode or DDR mode by being controlled by the control signal from the logic circuit 42.

Specifically, the selection circuits SEL1 and SEL4 are connected to a group of global data line pairs GIO16–GIO23, while the selection circuits SEL2 and SEL3 are connected to another group of global data line pairs GIO24–GIO31.

The selection circuits SEL1 and SEL2 receive the logic signal /MODE+MODE*AY0 and MODE signal, and have their selection state determined by these signals, i.e., whether the main amplifiers MA1 or write buffers WB are connected to the global data line pairs. Similarly, the selection circuits SEL3 and SEL4 receive the logic signal /MODE+MODE*/AY0 and MODE signal, and have their selection state determined by these signals, i.e., whether the main amplifiers MA1 or write buffers WB are connected to the global data line pairs.

The main amplifiers MA1, write buffers WB and selection circuits SL1–SL4 operate by being supplied with the stepped-down power voltage VCL.

(Global I/O Line Drivers)

The global I/O line driver GIO-DR is connected between the data input circuit 52 and the global data line pair GIO0–GIO31, and it operates in accordance with the clock signal DICLK and MODE signal to place the signal 51 from the data input circuit 52 on a corresponding global data line pair. Global I/O line drivers GIO-DR are provided for the global data line pairs individually, although only one is shown in FIG. 3. It operates by being supplied with the stepped-down power voltage VCL.

(Data input circuit 52)

The data input circuit 52 is connected between the external data terminals DQO–DQ15 and global I/O line drivers GIO-DR, and it operates in accordance with the MODE signal, data strobe clock signal DQSCLK and data input clock signal DICLK from the command state control circuit 19 to conduct the input data signals on the terminals DQO–DQ15 to the global I/O line drivers GIO-DR. The data input circuit 52 includes an input buffer 54 and a serial-to-parallel converter 53 provided for each of the 16 data terminals DQO–DQ15, although only one set is shown in FIG. 3.

The serial-to-parallel converter 53 operates in accordance with the MODE signal and clock signals DQSCLK and DICLK. In DDR mode, it converts 2-bit serial data 55 which is entered at each transition of the clock signal CLK into 2-bit parallel data. The covered data 51 is fed to the global I/O line driver GIO-DR.

The input buffer 54 operates by being supplied with the external power voltage VCC, while the serial-to-parallel converter 53 is supplied with the stepped-down power voltage VCL.

The data input circuit 52 will be explained in more detail in connection with the timing charts of FIG. 5 and following figures.

(Data Output Circuit 56)

The data output circuit 56 is connected between the global data line pairs GIO0–GIO31 and external data terminals DQO–DQ15 in correspondence to the 16 terminals DQO–DQ15, and it is made up of an output buffer 57 and a parallel-to-serial converter 58, although only one set is shown in FIG. 3. The parallel-to-serial converter 58 has a main output amplifier MA2 with its input connected to one of the global data line pairs GIO16–GIO23 of one group, and another main output amplifier MA2 with its input connected to one of the global data line pairs GIO24–GIO31 of another group.

The parallel-to-serial converter 58 operates in accordance with the clock signal DCLK, MODE signal and RAE signal. In the DDR mode, it converts the 2-bit parallel data coming in over global data line pairs of two groups into 2-bit serial data. The converted data is delivered through the output buffer 57 to the corresponding external data terminal DQ. The parallel-to-serial converter 58 operates by being supplied with the stepped-down power voltage VCL, while the output buffer 57 is supplied with the external power voltage VCC. The data output circuit 56 further includes main amplifiers MA2 corresponding to the global data line pairs GIO0–GIO15, although these amplifiers are omitted in FIG. 3.

The data output circuit 56 will be explained in more detail in connection with the timing charts of FIG. 5 and following figures.

(DQS Generation Circuit 59)

The DQS generation circuit 59 functions for the data read-out operation of a DDR-spec SDRAM to produce a data strobe signal DQs for data output to the data terminals DQO–DQI5. The circuit 59 receives the external power voltage VCC, stepped-down power voltage VCL, clock signal 7, clock signal DCLK, MODE signal and read signal R, and produces a data strobe signal DQS to be delivered to the external terminal DQS based on these voltages and signals.

When the MODE signal is high to configure a DDR-spec SDRAM, the DQS signal sets transitions of its level in synchronism with the timing of data output from the data terminals DQO–DQ15. The data strobe signal DQS makes a certain number of transitions based on information on the CAS latency and burst length of the data to be output to the data terminals DQO–DQ15.

When the MODE signal is low to configure a SDR-spec SDRAM, the DQS generation circuit 59 has an output of high-impedance state.

The read-out operation for the DDR-spec SDRAM will be explained in more detail by taking an example of the case where the CAS latency is 2 and the burst length is 4.

On receiving a read signal R having information which specifies a CAS latency of 2 and a burst length of 4, the DQS generation circuit 59 produces a data strobe signal DQS as follows.

The data strobe signal DQS turns from the high-impedance state to the low level and retains the low level for at least a ¾ period of the clock signal CLK. The transition from the high-impedance state to the low level is timed to the rising edge of the clock signal 7 which makes the transition at the rising edge of the clock signal CLK after one (CAS latency subtracted by 1) CLK period following the rising edge of CLK at which the circuit has received the read command.

Subsequently, the data strobe signal DQS sets four consecutive transitions for the burst in synchronism with the clock signal DCLK. Synchronization with DCLK is intended to synchronize the output of DQS with the timing of data output to the terminals DQO–DQ15 by the data output circuits 56 which takes place in synchronism with DCLK. The data strobe signal DQS sets the first low-to-high transition at the rising edge of the clock signal DCLK which makes the transition at the rising edge of the clock signal CLK after two (CAS latency) CLK periods following the rising edge of CLK at which the circuit has received the read command.

The DQS generation circuit 59 includes an output buffer (not shown) for the data strobe signal DQS, which has a level shift function and operates by being supplied with the external power voltage VCC. Other circuits (not shown) which constitute the DQS generation circuit 59 in unison operate by being supplied with the stepped-down power voltage VCL. (Mode signal generation circuit 68-1).

The mode signal generation circuit (or signal generation circuit) 68-1 produces a mode signal (or selection signal) MODE having its level determined by the input signal OPT received on the external terminal OPT.

The OPT signal specifies whether the semiconductor device CHIP operates as a SDR-spec SDRAM or DDR-spec SDRAM. Conceivably, it can be a mode setting signal for specifying the SDR mode or DDR mode of the semiconductor device, or it can be an option setting signal for choosing the SDR-spec or DDR-spec of the semiconductor device.

The MODE signal has is levels defined as follows, although no limitation is imposed on the invention in this regard. A high-level MODE signal instructs the semiconductor device to configure a DDR-spec SDRAM, while a low-level MODE signal instructs the device to configure an SDR-spec SDRAM.

Figure 9:
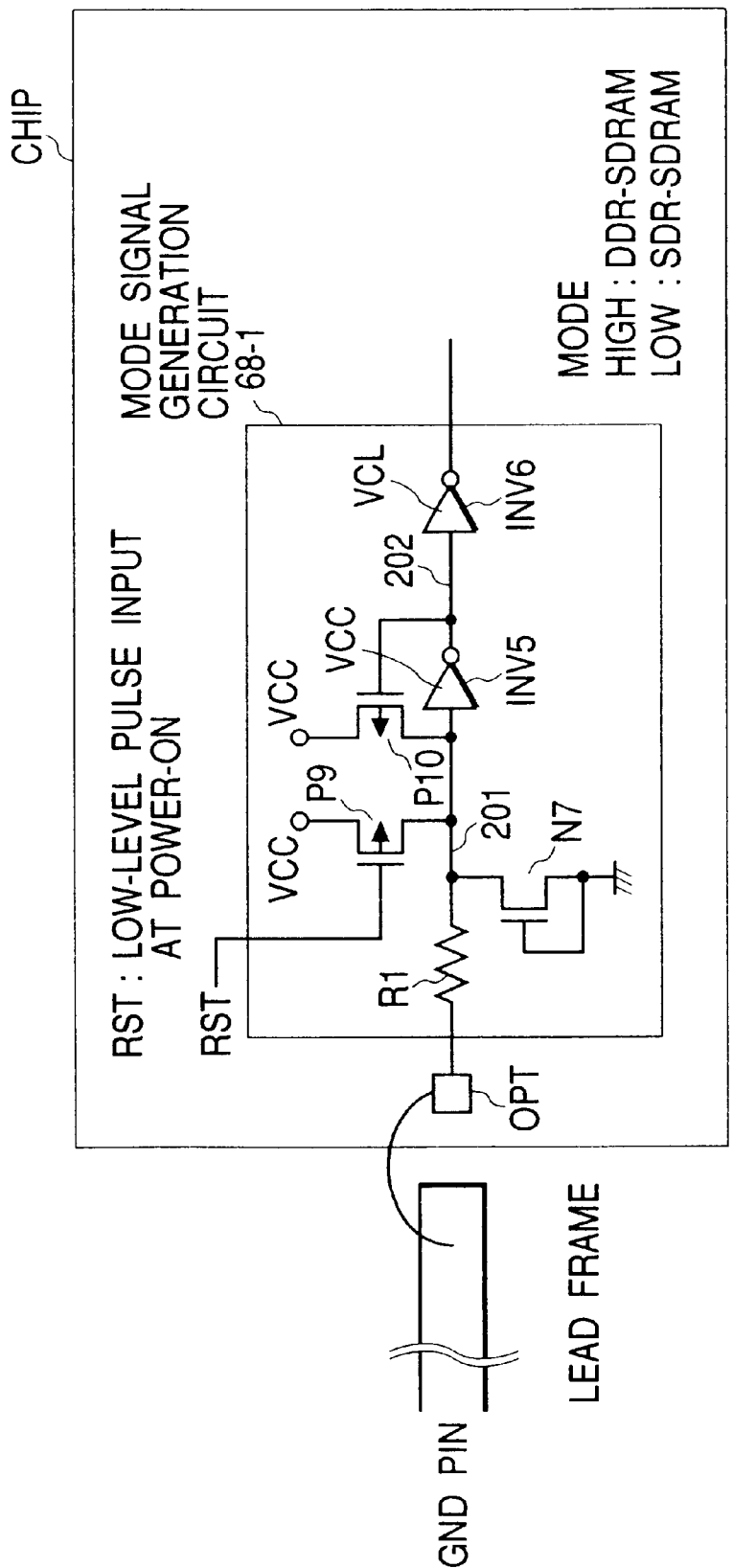
FIG. 9 is a schematic diagram of the mode signal generation circuit.

FIG. 9 shows a specific circuit arrangement of the mode signal generation circuit 68-1. It includes a preset bias circuit and a latch circuit. The preset bias circuit gives the external terminal OPT a bias voltage which is one logic level such as the power voltage VCC. Accordingly, the OPT terminal has the one logic level if it is not pulled to an external voltage through an external wiring such as a bonded wire, or has the external voltage level if it is supplied with the voltage through the external wiring. This circuit design is beneficial in terms of allowing the setting of the OPT terminal to one logic level without the need of an external wiring.

The mode signal generation circuit 68-1 receives a reset signal RST which is produced by the voltage generation circuit 1 such that it retains a reset level for a certain duration after the power voltage VCC has been applied to the device. The preset bias circuit operates only in the short duration of the reset signal RST upon turn-on of VCC, and the latch circuit fetches the then voltage level of the OPT terminal. This temporary operation of the preset bias circuit is also significant in terms of power saving during the steady operation of the device.

(Circuit Blocks Controlled by MODE Signal)

Among the circuit blocks explained in connection with FIG. 2 and FIG. 3, those controlled by the MODE signal are the clock input circuit 2, command state control circuit 19, write address shift register 27, mask control circuit 35, logic circuit 42, data output circuit 56, data input circuit 52, and selection circuits SEL1–SEL4 in the input/output circuit INT. These circuits are controlled depending on whether the semiconductor device configures a SDR-spec SDRAM or DDR-spec SDRAM.

FIG. 4 shows the details of the memory bank BankO, selection circuits SEL1 and SEL4, data output circuit 56, and data input circuit 52. The control of the selection circuits SEL1 and SEL4, data output circuit 56 and data input circuit 52 by the MODE signal will be explained in detail.

(Memory Bank BankO)

The memory bank BankO includes eight memory mat MAT1–MAT8 as mentioned previously, of which two memory mats MAT1 and MAT4 are shown in FIG. 4. The memory mats MAT1–MAT8 are accessed simultaneously in the case of the SDR-spec SDRAM. Indicated by MI01 in FIG. 4 is a main I/O line pair or main data line pair provided f or the memory mat MAT1. There are provided a main amplifier MA1 and a write buffer WB in correspondence to the main I/O line pair MI01.

Each memory mat is provided with main I/O line pairs, main amplifiers and write buffers equal in number to the number of bits accessed simultaneously. In this embodiment, one memory mat, e.g., MAT1, is designed to write and read out four bits, as also shown in FIG. 1. Accordingly, the memory mat MAT1 has four main I/O line pairs, four main amplifiers, and four write buffers, although only one set of MI01, MA1 and WB are shown in FIG. 4. Similarly, only one set of MI01, MA1 and WB are shown for the memory mat MAT4.

Depending on the hierarchical data line structure, the main I/O line pairs are connected with multiple local I/O line pairs (not shown) through switches (not shown). The local I/O line pairs are connected with multiple data line pairs through Y switches (not shown). The data line pairs are connected with sense amplifiers and dynamic memory cells.

Each memory cell includes a MIS transistor having its gate connected as memory cell selection terminal to a word line, and a capacitor connected between one end of the source-drain path of the MIS transistor and the common electrode which is supplied with VDL/2. The source-drain path has another end connected to one of the data line pair.

The main amplifier MA1 has its pair of input terminals connected to the main I/O line pair MIO1, and its pair of output terminals connected to input signal lines 101 and 102 of the selection circuit SEL1. The main amplifier MA1 is activated or deactivated by the main amplifier enable signal MAE from the read/write control circuit 50 (refer to FIG. 3).

Specifically, the amplifier MA1 responds to a high-level enable signal MAE to amplify complementary data signals on the main I/O line pair MI01 and place the amplified complementary output signals on the input signal lines 101 and 102.

It responds to a low-level enable signal MAE to bring both input signal lines 101 and 102 to the high level so that all logic NOR gates NOR1–NOR4 of the selection circuit SEL1 release low-level outputs.

The write buffer WB has its pair of input terminals connected to the output signal lines 103 and 104 of the selection circuit SEL1, and its pair of output terminals connected to the main I/O line pair MI01. The write buffer WB is activated or deactivated by the write buffer enable signal WAE from the read/write control circuit 50 (refer to FIG. 3). Specifically, the buffer WB responds to a low-level enable signal WAE to bring its output terminals to a high-impedance (or floating) state. It responds to a high-level enable signal WAE to place the complementary data signals received from the output signal lines 103 and 104 of the selection circuit SEL1 on the main I/O line pair MI01.

(Selection Circuit SELL)

The selection circuit SEL1 is made up of logic inverters INV1 and INV2, NOR gates NOR1–NOR4 n-channel MIS transistors N1–N4, and p-channel MIS transistors P1–P4. The input signal lines 101 and 102 are a pair of complementary input signal lines, on which the amplified complementary data signals from the main amplifier MA1 are placed as mentioned above.

The NOR gates NORI–NOR4 virtually serve as switches which receive the MODE signal from the mode signal generation circuit 68-1 (refer to FIG. 2) as a switching control signal.

Specifically, the NOR gates NOR2 and NOR4 respond to a low-level MODE signal indicative of SDR mode to conduct and release the input signal pair coming in over the input signal lines 101 and 102. At this time, the inverter INV2, which releases a high-level output due to the low-level MODE signal, causes the NOR gates NOR1 and NOR3 to produce low-level outputs regardless of the levels of the input signal lines 101 and 102.

Namely, the signal paths through the NOR gates NOR2 and NOR4 are granted, while the signal paths through the NOR gates NOR1 and NOR3 are negated in response to the low-level MODE signal.

Otherwise, in response to a high-level MODE signal indicative of the DDR mode, the inverter INV2 releases a low-level output, causing the NOR gates NOR1 and NOR3 to conduct and release the input signal pair coming in over the input signal lines 101 and 102, and the NOR gates NOR2 and NOR4 produce low-level outputs. Namely, the signal paths through the NOR gates NOR1 and NOR3 are granted, while the signal paths through the NOR gates NOR2 and NOR4 are negated in response to the high-level MODE signal.

The n-channel MIS transistors N1–N4, which constitute data output elements for driving the global I/O lines, have their gates connected to the outputs of the corresponding NOR gates NOR1–NOR4 and their source-drain paths connected between the corresponding signal lines 105–108 and the reference voltage source (ground voltage GND) of the device. The signal lines 105 and 106 are the global I/O line pair GIO16 and the signal lines 107 and 108 are the global I/O line pair GIO17 in FIG. 4.

The inverter INV2, NOR gates NOR1–NOR4 and MIS transistors N1–N4 form in unison the output switching circuit of the selection circuit SEL1. The p-channel MIS transistors P1–P4 in the selection circuit SEL1 form write data selectors which are controlled by the control signal /MODE+MODE*AYO provided by the logic circuit 42 (refer to FIG. 3).

The p-channel MIS transistor P1 has its source-drain path connected between the output signal line 103 and one line 108 of the global I/O line pair GIO17 and its gate supplied with the inverted version 110 of control signal produced by the inverter INV1. The p-channel MIS transistor P2 has its source-drain path connected between the output signal line 103 and one line 106 of the global I/O line pair GIO16 and its gate supplied with the control signal /MODE+MODE*/AYO. The p-channel MIS transistor P3 has its source-drain path connected between the output signal line 104 and another line 105 of the global I/O line pair GIO16 and its gate supplied with the control signal /MODE+MODE*AYO. The p-channel MIS transistor P4 has its source-drain path connected between the output signal line 104 and another line 107 of the global I/O line pair GIO17 and its gate supplied with the inverted control signal 110.

Next, the operation of the selection circuit SEL1 will be explained.

First, the selection circuit SEL1 operates for data read-out from the memory mat MAT1 as follows. In case a low-level MODE signal instructs the semiconductor device to configure a SDR-spec SDRAM, the signal lines 101 and 102 are connected to the global I/O line pair GIO16, so that readout data released from the main amplifier MA1 is placed on the global I/O line pair GIO16.

Otherwise, in case a high-level MODE signal instructs the semiconductor device to configure a DDR-spec SDRAM, the signal lines 101 and 102 are connected to the global I/O line pair GIO17, so that read-out data released from the main amplifier MA1 is placed on the global I/O line pair GIO17.

Next, the selection circuit SEL1 operates for data writing to the memory mat MAT1 as follows. In case a low-level MODE signal instructs the semiconductor device to configure a SDR-spec SDRAM, the control signal /MODE+MODE*AYO has a high level regardless of the y-system address bit AYO. By this high-level control signal, data to be stored, which is placed on the I/O line pair GIO17, is transferred to the write buffer WB by way of the MIS transistors P1 and P4 over the signal lines 103 and 104. Otherwise, in case a high-level MODE signal instructs the semiconductor device to configure a DDR-spec SDRAM, the connection between the global I/O line pair and the write buffer WB is determined by the level of MODE signal and the level of y-system address bit AYO. Specifically, if the MODE signal is high and the address bit AYO is also high, the control signal /MODE+MODE*AYO has a high level. By this high-level control signal, data to be stored on the I/O line pair GIO17 is transferred to the write buffer WB by way of the MIS transistors P1 and P4 over the signal lines 103 and 104. Otherwise, if the MODE signal is high and the address bit AYO is low, the control signal /MODE+

MODE*AY0 has a low level, and data to be stored on the I/O line pair GIO16 is transferred to the write buffer WB by way of the MIS transistors P2 and P3 over the signal lines 103 and 104.

(Selection Circuit SEL4)

The selection circuit SE14 is made up of a logic inverter INV3 NOR gates NOR5 and NOR6, n-channel MIS Transistors N5 and N6, and p-channel MIS transistors P5–P8. The input signal lines 111 and 112 are a pair of complementary input signal lines, on which are placed the amplified complementary data signals from the main amplifier MA1 which amplifies the signals on the main I/O line MI02.

The NOR gates NOR5 and NOR6 virtually serve as signal propagation elements by receiving the low-level ground voltage, providing the same signal propagation delay as that of the NOR gates NOR1–NOR4 of the selection circuit SEL1 explained previously, so that both selection circuits SEL1 and SEL4 have the same signal propagation characteristics.

The n-channel MIS transistors N5 and N6 constitute data output elements for driving the global I/O lines in the same fashion as the MIS transistors N1–N4 of SEL1. The p-channel MIS transistors P5–P8 constitute write data selectors which are controlled by the control signal /MODE+MODE*/AY0 provided by the logic circuit 42 (refer to FIG. 3).

The p-channel MIS transistor P5 has its source-drain path connected between the output signal line 114 and one line 108 of the global I/O line pair GIO17 and its gate supplied with the inverted version 113 of control signal produced by the inverter INV1. The p-channel MIS transistor P6 has its source-drain path connected between the output signal line 114 and one line 106 of the global I/O line pair GIO16 and its gate supplied with the control signal /MODE+MODE*/AY0. The p-channel MIS transistor P7 has its source-drain path connected between the output signal line 115 and another line 105 of the global I/O line pair GIO16 and its gate supplied with the control signal /MODE+MODE*/AY0. The p-channel MIS transistor P8 has its source-drain path connected between the output signal line 115 and another line 107 of the global I/O line pair GIO17 and its gate supplied with the inverted control signal 113.

Next, the operation of the selection circuit SEL4 will be explained.

First, the selection circuit SEL4 operates for data writing as follows. Read-out data amplified by the main amplifier MA1 is placed on the global I/O line pair GIO16 in both cases of the SDR-spec SDRAM and DDR-spec SDRAM. In case a high-level MODE signal instructs the semiconductor device to configure a DDR-spec SDRAM, the connection between the global I/O line pair and the write buffer WB is determined by the level of y-system address bit AY0.

Otherwise, when the MODE signal is high and the address bit /AY0 is also high, in which case the control signal /MODE+MODE*/AY0 becomes high, data to be stored, which is placed on the global I/O line pair GIO17, is transferred to the write buffer WB by way of the MIS transistors P5 and P8 over the signal lines 114 and 115. Otherwise, when the MODE signal is high and address bit /AY0 is low, in which case the control signal /MODE+MODE*/AY0 becomes low, data to be stored placed on the global I/O line pair GIO16 is transferred to the write buffer WB by way of the MIS transistors P6 and P7 over the signal lines 114 and 115.

The foregoing operation of the selection circuits SEL1 and SEL4 are summarized as follows. In case a low-level MODE signal instructs the semiconductor device to configure a SDR-spec SDRAM, the global I/O line pair GIO16 is set to serve exclusively for data read-out and the global I/O line pair GIO17 is set to serve exclusively for data writing.

More specifically, in the case of a read-out operation in the SDR mode, the two main amplifiers MA1 associated with the memory mats MAT1 and MAT4 are connected to the global I/O line pair GIO16, with another global I/O line pair GIO17 being left unused. In the case of a write operation in the SDR mode, the two write buffers WB associated with the memory mats MAT1 and MAT4 are connected to the global I/O line pair GIO17, with another global I/O line pair GIO16 being left unused.

For the SDR-spec SDRAM, the memory mats MAT1 and MAT4 are not selected simultaneously in both the write and read-out operations. In the read-out operation, one of the main amplifier MA1 associated with the memory mat MAT1 and that associated with the memory mat MAT4 is activated selectively. In the write operation, one of the write buffer WB associated with the memory mat MAT1 and that associated with the memory mat MAT4 is activated selectively. Accordingly, even if the two main amplifiers MA1 or two write buffers WB for the memory mats MAT1 and MAT4 are connected in common to the global I/O line pair GIO16 or GIO17, data on the main I/O line pair is not disturbed.

In contrast, for the DDR-spec SDRAM, the two global I/O line pairs GIO16 and GIO17 are used simultaneously in both the read and write operations. This feature will further be explained in the following.

In the read-out operation of the DDR-spec SDRAM, the memory mats MAT1 and MAT4 are selected simultaneously and both main amplifiers MA1 for the MAT1 and MAT4 are activated. Accordingly, the global 110 line pair GIO17 are connected to the main amplifier MA1 for the memory mat MAT1 and the global I/O line pair GIO16 are connected to the main amplifier MA1 for the memory mat MAT4. Consequently, the read-out data amplified by the two main amplifiers MA1 for the memory mats MAT1 and MAT4 are placed on the global I/O line pairs GIO17 and GIO16 by the selection circuits SEL1 and SEL4.

In the write operation of the DDR-spec SDRAM, with the address bit AY0 being low, the global I/O line pair GIO16 is connected to the write buffer WB for the memory mat MAT1 and the global I/O line pair GIO17 is connected to the write buffer WB for the memory mat MAT4. In the write operation of the DDR-spec SDRAM, with the address bit AY0 being high, the global I/O line pair GIO16 is connected to the write buffer WB for the memory mat MAT4 and the global I/O line pair GIO17 is connected to the write buffer WB for the memory mat MAT1. In this manner, in the write operation of the DDR-spec SDRAM, the memory mats MAT1 and MAT4 are selected simultaneously and both write buffers WB for the MAT1 and MAT4 are activated. Consequently, the data to be stored, which is amplified by the two main amplifiers MA1 for the memory mats MAT1 and MAT4, is placed on the main I/O line pairs MI01 and MI02, respectively.

For the DDR-spec SDRAM, memory mats twice in number relative to the SDR-spec SDRAM are selected, so that data twice in quantity per unit time is written in or read out of the memory mats.

(Data Output Circuit 56)

The data output circuit (or output circuit) 56 includes a parallel-to-serial converter 58 and an output buffer 57. The parallel-to-serial converter 58 includes main output amplifiers MA2-1 and MA2-2, data latches 119, 120 and 121, an AND gate AND8, a NAND gate NAND2, and a selector 116.

The main output amplifier MA2-1 is activated by the write amplifier enable signal RAE provided by the read/write control circuit 50 shown in FIG. 3 to amplify the signal on the global I/O line pair GIO16 at the low-to-high transition of the RAE signal, thereby producing an output signal 117. Similarly, the main output amplifier MA2-2 is activated by the RAE signal to amplify the signal on the global I/O line pair GIO17 at the low-to-high transition of the RAE signal, thereby producing an output signal 118.

The AND gate AND8 takes a logical product of the clock signal DCLK and MODE signal, thereby gating the clock signal with the MODE signal, and releases a resulting signal 123 to the clock input terminal CLK of the data latch 120. Similarly, the NAND gate NAND2 takes a logical product of the clock signal DCLK and MODE signal, thereby gating the clock signal with the MODE signal, and releases a resulting signal 124 to the clock input terminal CLK of the data latch 121.

The data latch 119, which has a clock input terminal CLK, signal input terminal D and signal output terminal Q, latches the output signal 117 of the main amplifier MA2-2 received on its D terminal in response to a low-to-high transition of the internal clock signal DCLK from the clock input circuit 2 received on its CLK terminal, and releases the latched output signal 125 from its Q terminal.

Similarly, the data latch 120, which has a clock input terminal CLK, signal input terminal D and signal output terminal Q, latches the output signal 117 of the main amplifier MA2-2 received on its D terminal in response to a low-to-high transition of the clock signal 123 provided by the AND gate AND8 received on its CLK terminal, and releases the latched output signal 126 from its Q terminal. The data latch 120 has its output on the Q terminal timed to the rising edge of the internal clock signal DCLK due to its clock gate circuit being formed of the AND gate AND8. The data latch 120 having a low output impedance releases the output signal during the high-level clock signal 123, and it turns the output terminal Q to a high-impedance (or floating) state in response to the fall of the clock signal 123.

Similarly, the data latch 121, which has a clock input terminal CLK, signal input terminal D and signal output terminal Q, latches the output signal 124 of the main amplifier MA2-2 received on its D terminal in response to a low-to-high transition of the clock signal 124 received on its CLK terminal, and releases the latched output signal 127 from its Q terminal. The data latch 120 has its output on the Q terminal timed to the falling edge of the internal clock signal DCLK due to its clock gate circuit formed of the NAND gate NAND2. The data latch 121 having a low output impedance releases the output signal during the high-level clock signal 124, and it turns the output terminal Q to a high-impedance (or floating) state in response to the fall of the clock signal 124.

The data latches 120 and 121 have their output terminals Q connected together, so that their output signals 126 and 127 are unified as signal 130. When the internal clock signal DCLK goes high, the data latch 120 turns to the low output impedance state as mentioned above, while the data latch 121 is in the high output impedance state, and the signal 130 is the same as the output signal Q of the data latches 120. Otherwise, when the internal clock signal DCLK goes low, the data latch 121 turns to the low output impedance state, while the data latch 120 turns to the high output impedance state, and the signal 130 is the same as the output signal Q of the data latches 121. The merged signal 130 which reflects the output signals of the data latches 120 and 121 is received as one input (second input) by the selector 116.

The selector 116 has a first input terminal 129 for receiving the signal 125, second input terminal 130 for receiving the signals 126 and 127, output terminal 131 for releasing an output signal 128, and control terminal 132 for receiving the MODE signal. In response to a low-level MODE signal for configuring a SDR-spec SDRAM, the selector 116 releases the signal on the first input terminal 129 from the output terminal 131. Otherwise, in response to a high-level MODE signal for configuring a DDR-spec SDRAM, it releases the signal on the second input terminal 130 from the output terminal 131.

The output buffer 57 receives the output signal 128 from the selector 116 and releases an output signal 133 to the external data terminal DQ8.

The operation of the data output circuit 56 in accordance with the MODE signal is summarized as follows. When the MODE signal is low to configure a SDR-spec SDRAM, the data output circuit 56 produces the output signal 133 based on the foregoing operation in response to a low-to-high transition of the internal clock signal DCLK which is produced from the clock signal 7. A high-to-low transition of DCLK does not cause the circuit 56 to vary its output. When the MODE signal is high to configure a DDR-spec SDRAM, the data output circuit 56 produces the output signal 133 by being timed to a low-to-high transition or high-to-low transition of the internal clock signal DCLK which is produced from the clock signal 6 provided by the clock generation circuit 3 shown in FIG. 2 and FIG. 3.

In the DDR mode, the internal clock signal DCLK advances in phase relative to the clock signal CLK by the delay time compensation mentioned previously. Accordingly, the transition in any direction of the internal clock signal DCLK takes place earlier than that of the external clock signal CLK, enabling the data outputs circuit 56 to release data to the external data terminal DQ by being given a certain setup time and hold time with respect to the transition of external clock signal CLK.

(Data Input-circuit)

The data input circuit 52 includes an input buffer 54 and a serial-to-parallel converter 53. The input buffer 54 has an input terminal connected to the external data terminal DQ8, and an output terminal for releasing an output signal 55 which is derived from the input signal. The serial-to-parallel converter 53 is made up of a data latches 134, 135, 136, 142 and 143 and a selector 137.

The data latch 134 has a clock input terminal /CLK, signal input terminal D and signal output terminal Q. The /CLK clock terminal receives a clock signal which is significant at the falling edge for the latch. The data latch 134 receives the clock signal DQSCLK provided by the AND gate AND7 shown in FIG. 3 and latches the input signal 55 on its input terminal D. i.e., the output signal of the input buffer 54, by being timed to a high-to-low transition of DQSCLK and releases an output signal 139.

The data latch 135 has a clock input terminal CLK, signal input terminal D and signal output terminal Q. The CLK clock terminal receives a clock signal which is significant at the rising edge for the latch. The data latch 135 latches the input signal 55 on its input terminal D by being timed to a low-to-high transition of the input DQSCLK clock received on its CLK terminal and releases an output signal 138.

The data latch 136 has a clock input terminal /CLK, signal input terminal D and signal output terminal Q. The data latch 136 latches the signal 138 on its input terminal D, i.e., the output signal of the data latch 135, by being timed to a high-to-low transition of the DQSCLK clock signal received on its /CLK terminal and releases an output signal 140.

The selector 137 has a first input terminal 144 for receiving the signal provided by the input buffer 54, second input terminal 145 for receiving the signal 140 provided by the data latch 136, output terminal 146 for releasing a selected output signal 141, and control terminal 131 for receiving the MODE signal. In response to a low-level MODE signal for configuring a SDR-spec SDRAM, the selector 137 releases the signal on the first input terminal 144 from the output terminal 146. Otherwise, in response to a high-level MODE signal for configuring a DDR-spec SDRAM, it releases the signal on its second input terminal 145 from the output terminal 146.

The data latch 142 has a clock input terminal CLK, signal input terminal D and signal output terminals Q and /Q. It latches the input signal 141 on its input terminal D, i.e., the output signal of the selector 137, by being timed to a low-to-high transition of the DICLK clock signal received on its clock input terminal CLK and releases an output signal 144b from the output terminal Q and the inverted version 145b of 144b from the output terminal /Q.

The data latch 143 has a clock input terminal CLK, signal input terminal D and signal output terminals Q and /Q. The data latch 143 latches the signal 139 on its input terminal D, i.e., the output signal of the data latch 134, by being timed to a low-to-high transition of the DICLK clock signal received on its CLK terminal and releases an output signal 146b from the output terminal Q and the inverted version 147 of 146b from the output terminal /Q.

The data input circuit 52 is controlled by the MODE signal as follows.

When the MODE signal is low to configure a SDR-spec SDRAM, data coming in through the data terminal DQ8 is conducted as signal 55 through the input buffer 54. The signal 55 is conducted through the selector 137 to the latch 142, which latches the signal by being timed to a low-to-high transition of the DICLK clock signal and releases signals 144b and 145b. The remaining latches 134, 135 and 144 are left unused in this SDRAM mode.

Otherwise, when the MODE signal is high to configure a DDR-spec SDRAM, first data coming in through the data terminal DQ8 is conducted as signal 55 through the input buffer 54. The signal 55 is latched by the latch 135 at a low-to-high transition of the DQSCLK clock signal. The output signal 138 of the latch 135 is latched by the latch 136 at a high-to-low transition of the DICLK clock signal. At this time, second input data is coming to the data terminal DQ8, and it is conducted through the input buffer 54 and latched by the latch 134. Accordingly, the 2-bit data coming to the data terminal DQ8 at the rising and falling edges of the DQSCLK clock signal is latched by the latches 134 and 136 successively. At the next low-to-high transition of the DICLK clock signal, the data held by the latches 134 and 136 are transferred to the latches 142 and 143, which latch and release the data as complementary output data 144b and 145 and 146b and 147.

(Global I/O Line Pair Drivers)

The global I/O line pair drivers consist of four drivers 149–152. Each of these drivers 149–152 has control input terminals for receiving the MODE signal and clock signal 148, data input terminals for receiving the data signals 144b, 145, 146b and 147, and an output terminal for releasing an output signal to one of signal lines 107, 108, 105 and 106 which global I/O lines.

The drivers 149–152 operate by being controlled in common by the MODE signal and the inverted version 148 of KICLK clock signal produced by the inverter INV4. A group of the first and second drivers 149 and 150 and another group of the third and fourth drivers 151 and 152 operate differently in the SDRAM mode set by a low-level MODE signal.

Specifically, when the MODE signal is low to configure a SDR-spec SDRAM, the first and second drivers 149 and 150 operate based on the clock signal 148, i.e., in response to the falling edge of the clock signal, to place the signals 144b and 145b on the signal lines 107 and 108. These drivers 149 and 150 are deactivated to have a high-impedance state in response to the rising edge of the clock signal 148. In response to the low-level MODE signal, the third and fourth drivers 151 and 152 are deactivated steadily to have a high-impedance state.

Otherwise, when the MODE signal is high to configure a DDR-spec SDRAM, all the first through fourth drivers 149–152 operate in response to the falling edge of the clock signal 148 to place the signals 144b to 146b and 147 on the signal lines 105–108. Namely, these drivers are activated by a high-level DICLK clock signal (or low-level clock signal 148), and deactivated by a low-level DICLK clock signal (or high-level clock signal 148) to have the high-impedance state.

The global I/O line pairs are connected, when necessary, with a precharge circuit (not shown) which establishes a certain voltage on the global I/O line pairs in response to the low-level DICLK clock signal, so that input data settles on the global I/O lines much faster.

Next, the operation of the SDR-spec SDRAM and DDR-spec SDRAM will be explained with reference to the timing charts of FIG. 5 and FIG. 6, respectively.

Figure 5:
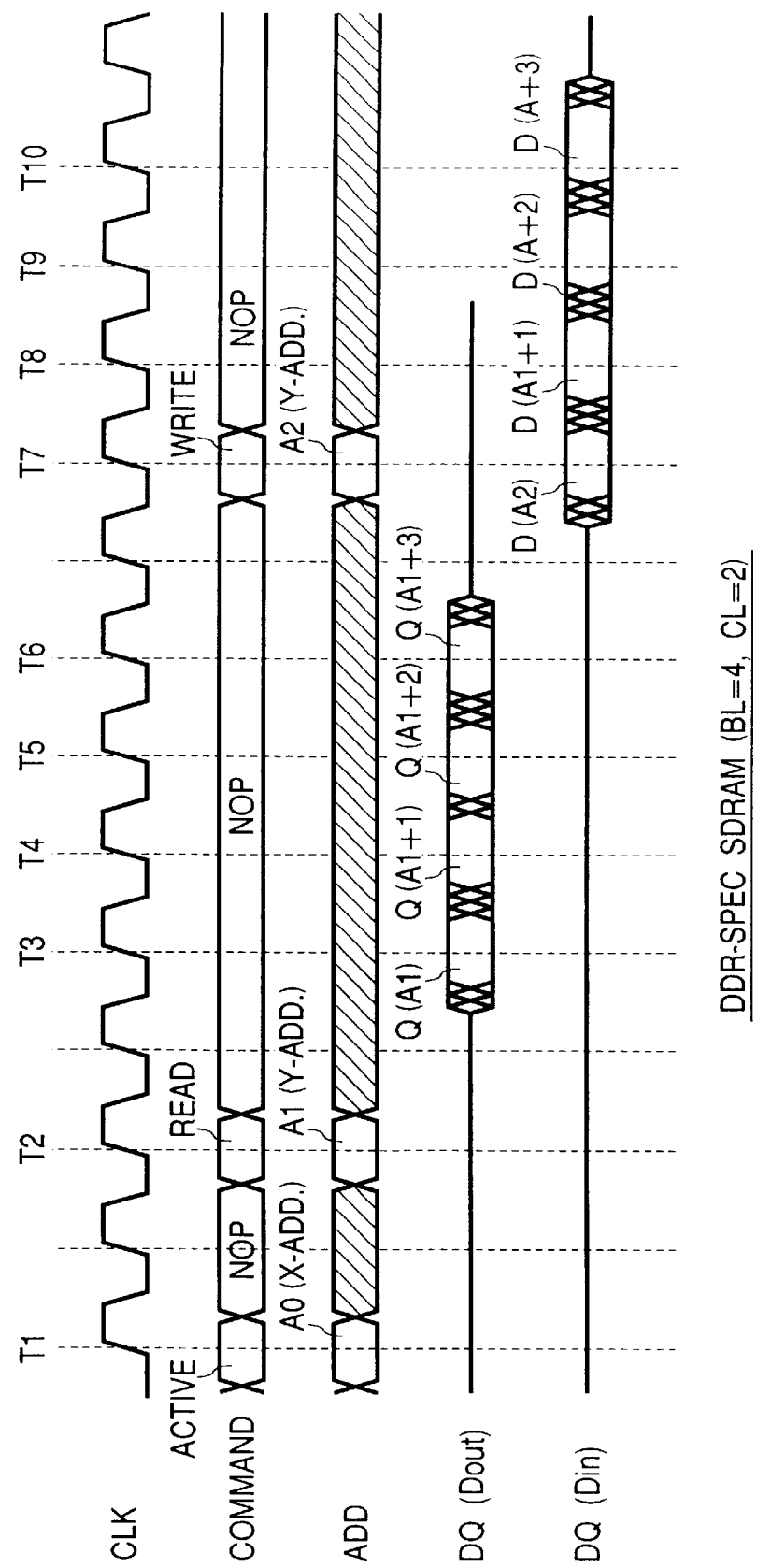
FIG. 5 is a timing chart illustrating the operation of the DDR-spec SDRAM.

FIG. 5 shows the operational timing of the SDR-spec SDRAM with the setup of a CAS latency of 2 and a burst length of 4. The CAS latency signifies the time length in terms of the number of CLK clock cycles after the read command is entered until the first data is released. For example, in the case of a CAS latency of 2, the first read-out data is released at a time point which is later by two CLK cycles than the entry of the read command. The burst length signifies the number of pieces of data transacted serially by one read command or write command.

Active command data which has been entered to the semiconductor device is decoded by the decoder 21 and held by the command register 20 in the command state control circuit 19 at a rising time point T1 of the external clock signal CLK. Concurrently to this decoding operation, the entry of an address signal and associated operation take place. Specifically, an x-system address signal A0,(X-ADD) applied to the address terminals Add0–Add12 is taken into the semiconductor device and the x-system access operation takes place, i.e., a certain word line WL is selected by the operation of the x-address decoder XDEC, main word line drivers 46 and sub word line drivers 45.

At time point T2, read command data which has been entered to the semiconductor device is decoded by the decoder 21 and held by the command register 20 in the command state control circuit 19. Concurrently with this operation, a y-system address signal Al (Y-ADD) supplied to the address terminals Add0–Add8 is taken in, and the y-system access operation takes place. Data read out of the memory cells selected by the x-system address signal and y-system address signal is transferred to the data output circuit 56 over the data line pairs DL, local I/O line pairs I/O, main I/O line pairs MIO, and global I/O line pairs GIO. The read-out data is sent out of the semiconductor device at the next time point T3.

The y-system address signal Al (Y-ADD) is incremented by 1 to form an address signal A1+1 (Y-ADD), and data read out of the memory cells selected by this y-system address signal A1+1 (Y-ADD) and the x-system address signal AO (X-ADD) is transferred to the data output circuit 56. The read-out data is sent out of the semiconductor device at the next time point T4. In the same manner, the y-system address signal A1 (Y-ADD) is incremented by 2 and 3 to form y-system address signals, and data read out of the memory cells selected by these y-system address signals and the x-system address signal are transferred to the data output circuit 56 and sent out of the semiconductor device at time points T5 and T6.

Based on the burst length of 4 of this example, 4-bit data Q(A1), Q(A1+1), Q(A1+2) and Q(A1+3) are sent out sequentially at the successive low-to-high transitions of the external clock signal CLK for the read command which was received at time point T3.

At time point T7, write command data which has been entered to the semiconductor device is decoded by the decoder 21 and held by the command register 20 in the command state control circuit 19. Concurrently with this operation, a y-system address signal A2 (Y-ADD) supplied to the address terminals AddO–Add8 is taken in, and the y-system access operation takes place. Specifically, signals for selecting certain y-selection lines YS and switches LSW located between main I/O line pairs MIO and local I/O line pairs LIO are produced. Data D(A2) supplied to the data terminal DQ is taken into the semiconductor device at the time point T7. Then, the data D(A2) is written to certain memory cells which are selected by the x-system address signal AO (X-Add) which was entered at the time point T2 and the y-system address signal A2 (Y-Add) entered at the time point T7.

The y-system address signal A2 (Y-ADD) is incremented by 1 to form an address signal A2+1 (Y-ADD) by the burst counter BC, and y-selection lines YS and switches LSW are selected by this y-system address signal. Then, data D(A2+1) to the semiconductor device is written to certain memory cells which are selected by the y-system address signal A2+1 (Y-ADD) and x-system address signal AO (X-Add). In the same manner, the y-system address signal A2 (Y-ADD) is incremented by 2 and 3 to form y-system address signals, and data D(A+2) and D(D+3) entered at time points T9 and TIO are written sequentially to certain memory cells which are selected by these y-system address signals and the x-system address signal.

Figure 6:
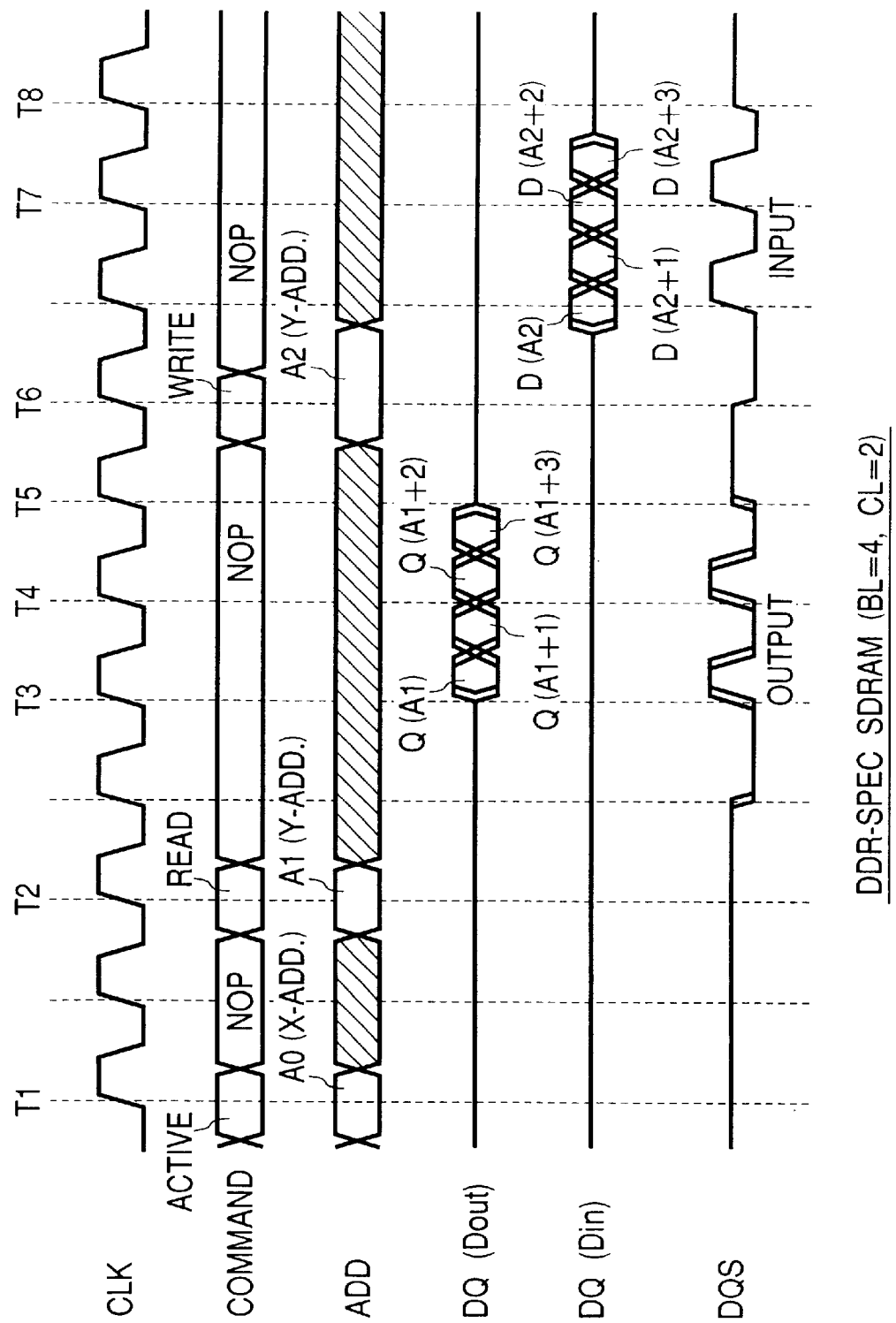
FIG. 6 is a timing chart illustrating the operation of the DDR-spec SDRAM.

Next, the operation of the DDR-spec SDRAM will be explained with reference to the timing charts of FIG. 6, showing an example with the setup of a CAS latency of 2 and a burst length of 4. The operation of this semiconductor device CHIP synchronized with the external clock signal CLK is identical to the case of the SDR-spec SDRAM shown in FIG. 5, and the following mainly explains the differences from the SDR-spec SDRAM.

In contrast to the foregoing SDR-spec SDRAM in which data input and output take place only at the rise of external clock signal CLK, the DDR-spec SDRAM shown in FIG. 6 have the data input and output actions occur at both rise and fall of the clock signal CLK.

The DDR-spec SDRAM has a data strobe signal DQS established on the DQS terminal. In the read-out operation, the DQS signal is sent out of the semiconductor device together with read-out data. In the write operation, the DQS signal is supplied to the semiconductor device together with input data to be stored. The transaction of data accompanied by the data strobe signal is intended for the higher data transfer rate expected of the DDR-spec SDRAM, and it enhances the reliability of data transaction with an external device such as a memory controller (not shown).

The output circuit in the semiconductor device CHIP for delivering the data strobe signal DQS becomes a high output impedance state on completion of data output, enabling the external terminal DQS to receive a data strobe signal from the external device. More specifically, at the transition to the state of data transaction with an external device, e.g., memory controller, the strobe signal output circuit retains the strobe signal DQS at the low level for a ¾ CLK cycle, which is called the preamble period, and thereafter releases the high-level DQS signal.

In the write operation, in contrast to the SDR-spec SDRAM which takes in data by being timed to the entry of the write command, the DDR-spec SDRAM takes in data at a time point which is later by one CLK cycle than the entry of the write command. The reason for this time shift is that a preamble period of a ¾ CLK cycle is needed before the DQS signal attached to input data turns from low to high.

Next, the read-interrupt-write operation, i.e., the operation with the entry of a read command followed after one CLK cycle by the entry of a write command, of the SDR-spec SDRAM and DDR-spec SDRAM will be explained with reference to FIG. 7 and FIG. 8. A matter of notice on this operation is that the SDR-spec SDRAM cannot use the global I/O line pairs in common for both reading and write, whereas the DDR-spec SDRAM can do.

Figure 7:
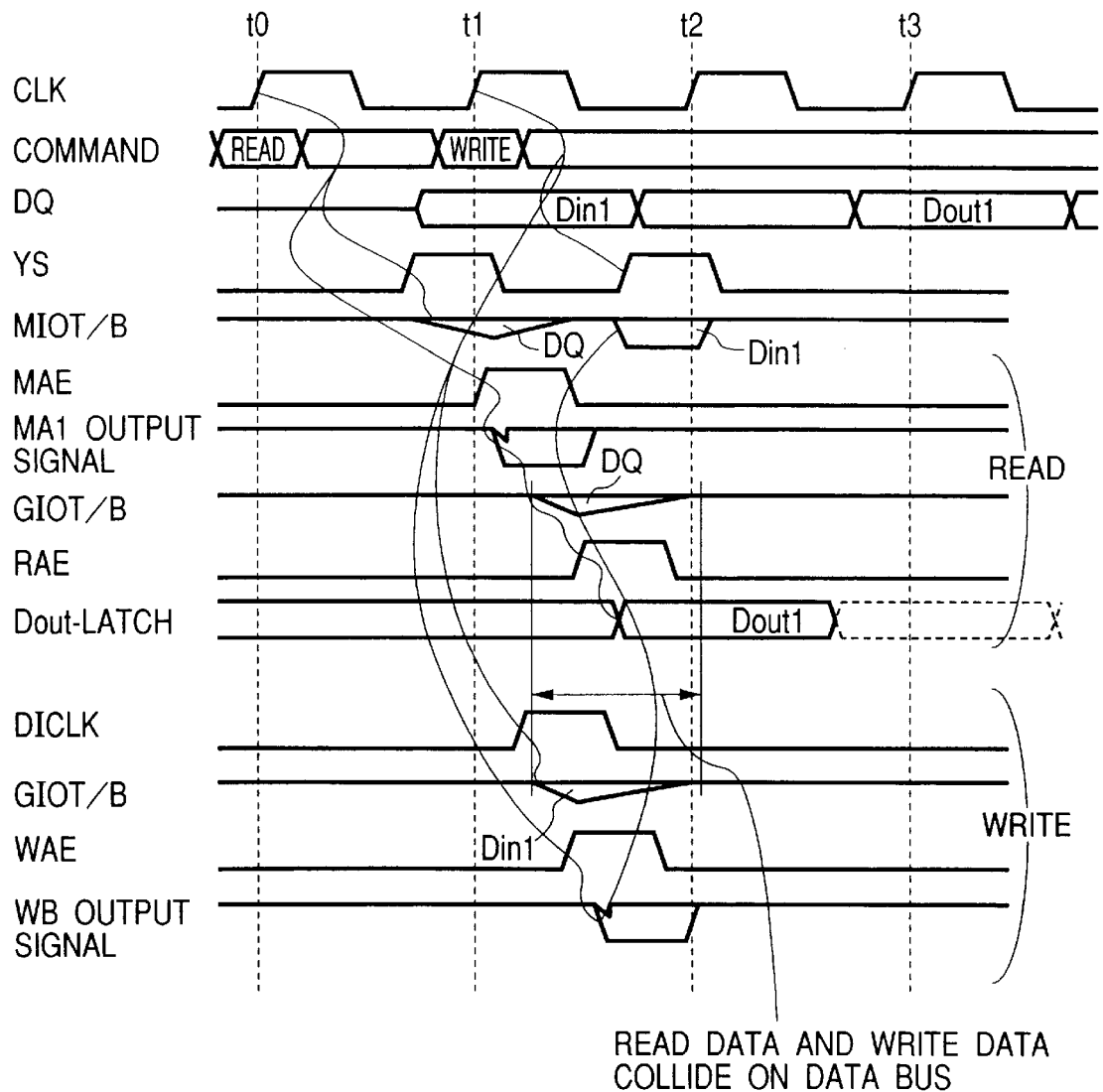
FIG. 7 is a timing chart illustrating the read-interrupt-write operation of the SDR-spec SDRAM.
Figure 8:
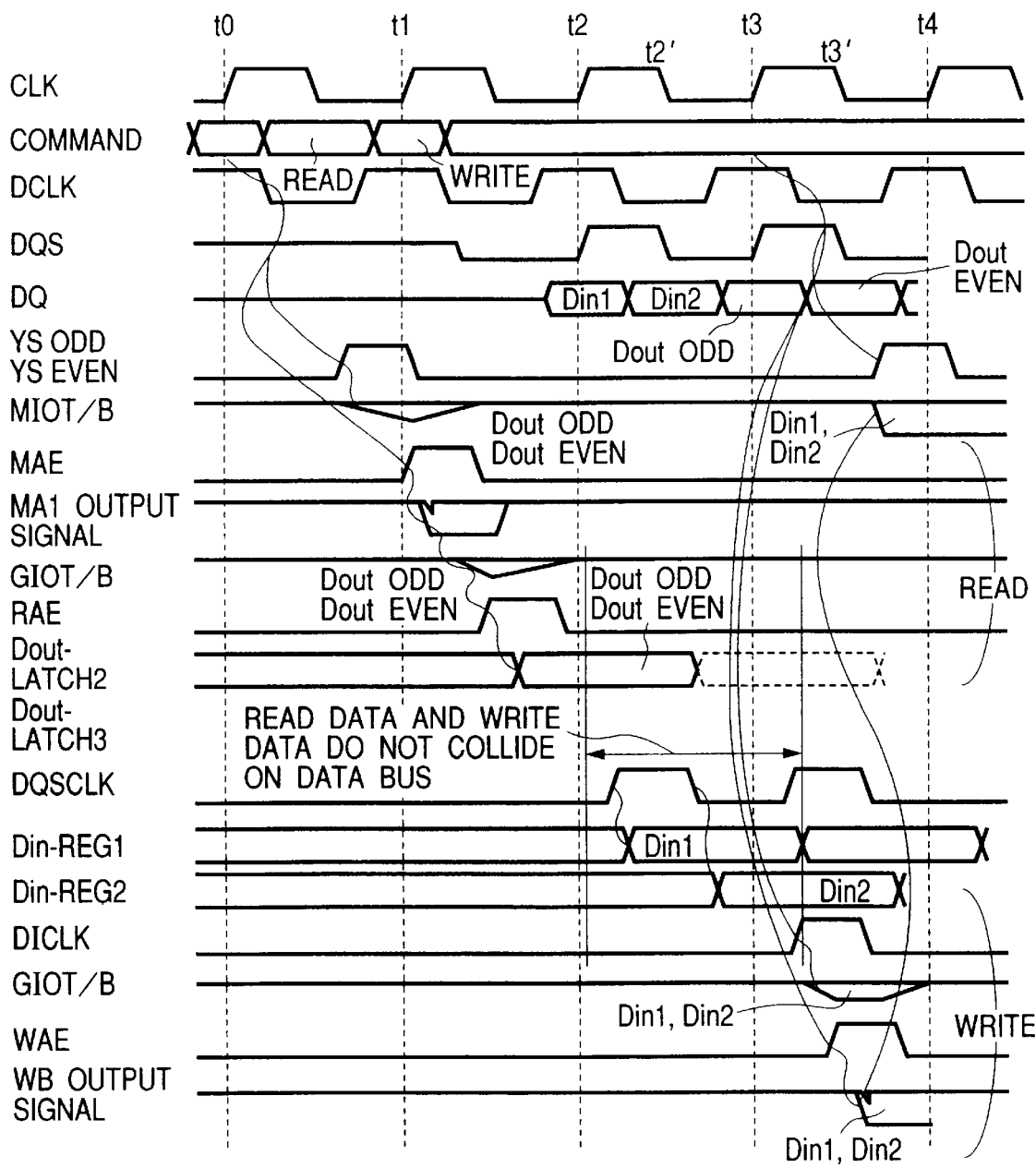
FIG. 8 is a timing chart illustrating the read-interrupt-write operation of the DDR-spec SDRAM.

FIG. 7 shows the read-interrupt-write operation of the SDR-spec SDRAM. Before time point tO on this timing chart, active command data and an x-system address signal are entered to select a certain word line, although the operation before the time point to is disregarded in this figure. The timing of address signal input is also omitted in this figure. FIG. 5 should be referenced for the input timings of active command data and the address signal.

First, a series of read-out operation steps which are commenced by the read command entered at time point tO will be explained. Shown in FIG. 7 is an example with the setup of a CAS latency of 3 and a burst length of 1 for the read command.

In FIG. 7, the supply of read command data from the external device to the /CS, /PAS, /CAS and /WE terminals and part of the address terminals begins in advance by a ¼ CLK cycle of the rising CLK clock signal at time point tO. The read command data is taken into the command state control circuit 19 by being timed to the settling of the data level at tO, and then is decoded by the decoder 21.

In accordance with the decoded read command data, certain y-selection lines YS and switches LSW for connecting main I/O line pairs MIO and local I/O line pairs LIO are made conductive. Memory cells are selected in accordance with the x-system address signal and y-system address signal, and stored data is read out of the memory cells. The read-out data is placed on the main I/O line pairs MIOT/B by way of the data line pairs DL and local IO line pairs.

The read-out data placed on the main I/O line pairs MIOT/B is amplified by the main amplifiers MA1 which commence the amplifying operation at the low-to-high transition of the main amplifier enable signal MAE. The amplified read-out data is placed on global I/O line pairs at an intermediate time point between t1 and t2.

The read-out data on the global I/O line pairs is amplified by the main amplifiers MA2 in the data output circuit 56 by being timed to the low-to-high transition of the RAE signal, and then it is transferred and held by the data latch 119 (or Dout-latch1).

The output buffer 57 releases the read-out data (data Dout1) to the external data terminals DQ at time point t3 which is later by three CLK cycles than the read command data input. More precisely, the release of read-out data from the output buffer 57 commences approximately in advance by a ¼ clock cycle of the time point t3, instead of the rise at t3 after three CLK cycles, and the data settles at t3. Although the commencement of data output and the settling of data differ in timing, the data settlement and output will not be described distinctively for the simplicity of description since their accurate timing relation is shown in the figure.

Next, a series of write operation steps for write command data which is entered at time point t1 will be explained in connection with FIG. 7. The write command and input data Din1 are entered to the SDRAM at time point t1 which is later by one CLK cycle than the time point t0. The write command data is decoded by the decoder 21.

The internal clock signal DICLK rises in response to the rise of the clock signal CLK at time point t0. Input data Din1 entered at the time point t0 is placed on the global I/O line pairs by being timed to the rise of DICLK.

In response to the rise of the clock signal CLK at the time point t1, the write amplifier enable signal WAE rises to activate the write buffers WB, thereby transferring the input data on the global I/O line pairs to the main I/O line pairs MIOT/B. The input data placed on the main I/O line pairs MIOT/B is written by way of the local I/O line pairs LIO and data line pairs DL to the memory cells selected by the x-system address signal and y-system address signal at a time point (not shown).

Here is a remark on the dealing of data on the global I/O line pairs in the foregoing read operation and write operation. In the read-out operation, the main amplifiers MA1 place the read-out data on the global I/O line pairs at an intermediate time point between t1 and t2, and in the write operation, the input data is placed on the global I/O line pairs also at a time point between t1 and t2.

Accordingly, in the foregoing read-interrupt-write operation of the SDR-spec SDRAM, there is a timing at which the global I/O line pairs are used simultaneously for the read-out operation by a read command and the write operation by a write command. Therefore, it becomes necessary to separately provide global I/O line pairs for writing and global I/O line pairs for read-out, i.e., global I/O line pairs of 2-fold bits, for the SDR-spec SDRAM. For the 16-bit data line scheme of the SDR-spec SDRAM of this embodiment 16 pairs of global I/O lines for writing and 16 pairs of global I/O lines for read-out, i.e., a total of 32 pairs, are required.

Next, the read-interrupt-write operation of the DDR-spec SDRAM will be explained with reference to FIG. 8 for an example with the setup of a CAS latency of 2 and a burst length of 2.

First, a series of read-out operation steps for read command data which is entered at time point t0 will be explained.

Read command data is entered to the SDRAM device at the rise of clock signal CLK at time point t0. The read command data is decoded by the decoder 21. The read command data is supplied to the ICS, /RAS, /CAS and /WE terminals and part of address terminals, as in the preceding case of the SDR-spec SDRAM.

In accordance with the read command data, certain y-selection lines YS and switches LSW for connecting main I/O line pairs MIO and local I/O line pairs LIO are made conductive. Stored data read out of memory cells selected in accordance with the x-system address signal and y-system address signal is placed on the main I/O line pairs MIOT/B by way of the data line pairs DL and local I/O line pairs.

The read-out data placed on the main I/O line pairs MIOT/B is amplified by the main amplifiers MA1, which commence the amplifying operation at the low-to-high transition of the main amplifier enable signal MAE. The amplified read-out data is placed on the global I/O line pairs at an intermediate time point between t1 and t2. The amplified read-out data is placed on the global I/O line pairs at an intermediate time point between t1 and t2.

The read-out data on the global I/O line pairs is amplified by the main amplifiers MA2 in the data output circuit 56 by being timed to the low-to-high transition of the RAE signal, and then it is transferred and held by the data latches 120 and 121 (or Dout-latch2 and latch3).

The output buffer 57 releases the readouts data (data Doutodd) to the external data terminals DQ at time point t3 which is later by three CLK cycles than the read command data input. Subsequently, the output buffer 57 releases the read-out data (data Douteven) to the external data terminals DQ at time point t3' which is later by a half CLK cycle than t3.

Next, a series of write operation steps for write command data which is entered at time point t1 will be explained. The write command data is entered to the SDRAM at time point t1 which is later by one CLK cycle than the time point t0. The write command data is decoded by the decoder 21. The strobe signal DOS is kept at the low level for a ¾ CLK cycle until time point t2, at which it is turned to the high level.

Input data Din1 which is entered at time point t2 is held by the latch 135 at the low-to-high transition of the DQS-CLK clock signal. Input data Din2 which is entered at time point t2' is held by the latch 134 at the high-to-low transition of the DQSCLK clock signal, at which the input data Din1 held in the latch 135 is transferred to the latch 136.

The internal clock signal DCLK rises in response to the rise of the clock signal CLK at time point t3. Input data Din1 held in the latch 136 and input data Din2 held in the latch 134 are placed on the global I/O line pairs in response to the rise of the internal clock signal DCLK.

In response to the rise of the clock signal CLK at the time point t3, the write amplifier enable signal WAE rises to activate the write buffers WB, thereby transferring the input data Din1 and Din2 on the global I/O line pairs to the main I/O line pairs MIOT/B. The input data placed on the main I/O line pairs MIOT/B are written by way of the local I/O line pairs LIO and data line pairs DL to the memory cells selected by the x-system address signal and y-system address signal at a time point (not shown).

Here is a remark on the dealing of data on the global I/O line pairs in the foregoing read-out operation and write operation. In the read-out operation, the main amplifiers MA1 place the read-out data on the global I/O line pairs at an intermediate time point between t1 and t2, and in the write operation, the input data is placed on the global I/O line pairs at a time point between t3 and t4. Accordingly, in the foregoing read-interrupt-write operation of the DDR-spec SDRAM, there is no timing at which the global I/O line pairs are used simultaneously f or the read operation by a read command and the write operation by a write command.

In other data transacting operations as well as the read-interrupt-write operation, the DDR-spec SDRAM can prevent the simultaneous use of the global I/O line pairs for both the read operation by a read command and the write operation by a write command. Consequently, the DDR-spec SDRAM can use one set of global I/O line pairs in common for data writing and read-out.

For the DDR-spec SDRAM, it is desirable to take a bit width conversion of 2-to-1or 1-to-2 for the data input/output operations by utilization of the parallel-to-serial converter 58 or serial-to-parallel converter 53. Although the bit width conversion imposes an increased number of data bits to be processed simultaneously or an increased number of signal lines, it is beneficial as follows. It becomes possible for the principal internal circuits of the semiconductor device to operate relatively slower to an extent of matching with the external clock signal CLK based on the bit width conversion in spite of the data transaction with an external device at both the rise and fall of CLK.

In conclusion, it is preferable for both the SDR-spec SDRAM and DDR-spec SDRAM, which use the global I/O line pairs in different fashions, to have twice as many global I/O line pairs as the data bit width, provided that the bit width is common to the SDRAMs of both types.

Based on the above-mentioned feature, this embodiment is designed to have twice as many global I/O line pairs as the data bit width and to alter their usage in response to the MODE signal. Specifically, selection circuits SEL, which are controlled by the MODE signal, are provided between the global I/O line pairs and main amplifiers MA1 and between the global I/O line pairs and write buffers WB, with the data input circuit 52 and data output circuit 56 being controlled by the MODE signal.

In the case of an SDR-spec SDRAM, the selection circuits SEL and data output circuit are controlled so that read-out data from the main amplifiers MA1 is transferred to the data output circuit by using exclusive reading global I/O line pairs that are a half of all the global I/O line pairs, and the selection circuits SEL and data in-out circuit are controlled so that input data entered to the data input circuit is transferred to the write buffers WB by using exclusive writing global I/O line pairs that remain half of all the global I/O line pairs.

In the case of a DDR-spec SDRAM, the selection circuits SEL and data output circuit are controlled so that read-out data from the main amplifiers MA1 is transferred to the data output circuit in two operations by using all the global I/O line pairs, and the selection circuits SEL and the data input circuit are controlled so that input data entered to the data input circuit is transferred to the write buffers WB in two operations by using all of the global I/O line pairs.

As an alternative scheme different from the foregoing embodiment, a semiconductor device which is intended for the configuration of either an SDR-spec SDRAM or DDR-spec SDRAM by a uniform chip may be provided with global I/O line pairs used exclusively for the SDR-spec SDRAM and global I/O line pairs used exclusively for the DDR-spec SDRAM, with these global I/O line pairs being switched depending on the selected mode. A larger chip area for the increased number of I/O lines will be required in this case however.

Whereas, the foregoing embodiment enables the effective use of a relatively smaller number of global I/O line pairs, so that the chip area necessary for the I/O lines is relatively small.

FIG. 9 shows the details of the mode signal generation circuit 68-1, and also shows the relation between the circuit 68-1 and the lead. The mode signal generation circuit 68-1 is made up of a resistor R1, an n-channel MIS transistor N7, p-channel MIS transistors P9 and F10, and logic inverters INV5 and INV6.

The semiconductor device CHIP is provided on its top with a bonding pad OPT which is connected electrically to the input of the mode-signal generation circuit 68-1 and also can be bond-wired externally. This bonding pad OPT serves for the option pad for selecting functions of the semiconductor device. The resistor R1 connected between the bonding pad OPT and the node 201 of the circuit 68-1 and the n-channel MIS transistor N7 having its source and drain connected together to form a diode between the node 201 and the ground terminal 201 constitute in unison an input protection circuit which protects the inverter INV5 from surge voltages which can be applied by electrostatic voltage sources or the like. The resistor R1 is formed of a well region having a relatively large resistance.

The p-channel MIS transistor P9 has a gate which receives the reset signal RST and a source-drain path connected between the external power voltage VCC and node 201, thereby constituting the preset bias circuit mentioned previously. Namely, the reset signal RST is a pulse signal which goes low, e.g., to the ground voltage, temporarily when the semiconductor device is turned on, and thereafter returns to a high level, e.g., VCC voltage. In response to the reset signal RST, the p-channel MIS transistor P9 becomes conductive to supply a preset bias voltage to the node 201 only during the temporary period at power-on.

In case the bonding pad OPT is not connected externally, the node 201 is pulled to the high-level power voltage VCC through the p-channel MIS transistor P9 at the power-on event. Otherwise, in case the bonding pad OPT is grounded through an external wire, the node 201 is kept at the low level regardless of the conduction state of the transistor P9.

The p-channel MIS transistor P9 and inverters INV5 form in unison a latch circuit, which holds the signal level of the node 201 and releases the inverted signal level from its output 202. Another inverters INV6 inverts the output of INV5 to produce the mode signal MODE.

In case the semiconductor device has external terminals aligning in the longitudinal central area on the chip so as to be adapted to the LOC packaging scheme of resin-sealed semiconductor devices mentioned previously, the bonding pad OPT is preferably disposed among the terminals. For the facility of grounding the bonding pad OPT when necessary, an external grounding terminal GNDPIN may be provided among the LOC-based external terminals. In this case, the semiconductor device which is intended to configure a SDR-spec SDRAM has its bonding pad OPT connected to the GNDPIN terminal through a metallic wire or the like. Otherwise, the semiconductor device which is intended to configure a DDR-spec SDRAM has its bonding pad OPT left open-circuited.

This function selection by a simple addition of a wire is advantageous in the elimination of the need for alteration of the external wiring design. An alternative scheme of function selection involves the connection or disconnection of the bonding pad OPT to the ground line based on a mask, e.g., final wiring mask, used in the fabricating process.

The SDR-spec SDRAM is occasionally required to accept a non-steady period clock signal having its period changed in a relatively short interval with the intention of reducing the noise generation which is based on the fact that the noise created by an application electronic system operating under a clock signal is reduced by using a non-steady period clock signal or by changing the clock period in a relatively short interval as described previously.

Figure 10:
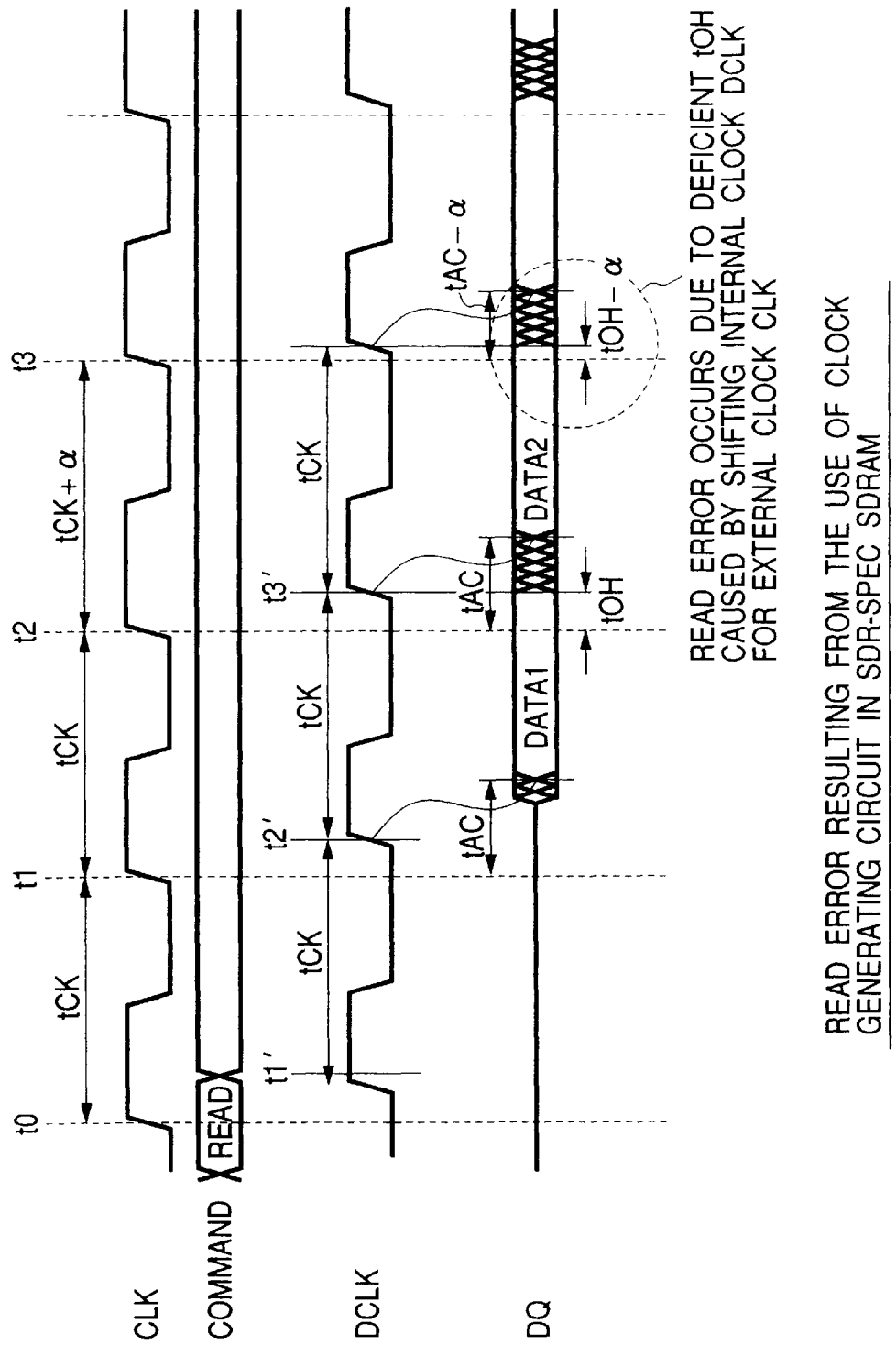
FIG. 10 is a timing chart illustrating the operation of the SDR-spec SDRAM.

The following explains with reference to FIG. 10 why the semiconductor device of the foregoing embodiment which configures an SDR-spec SDRAM using a clock regenerating circuit cannot occasionally deal with a relatively fast change in period of the external clock signal. FIG. 10 shows the read-out operation with a burst length of 2. The clock signal DCLK (or internally regenerated clock) shown in the figure is produced by a clock regenerating circuit mentioned previously which receives a clock signal synchronized with the external clock signal which is supplied to the semiconductor device.

This clock regenerating circuit 3 uses a PLL circuit, while it can also use a DDL circuit or SMD circuit as mentioned previously. The clock regenerating circuit 3, in the case of receiving an external clock signal with a virtually constant period, produces an internal clock signal DCLK which is timed to compensate for the signal propagation delay of the internal circuits. However, for a circuit which produces a signal that is synchronous with an external signal based on the variable delay and phase discrimination of the PLL circuit, DLL circuit or SMD circuit, it is difficult to be responsive to relatively fast changing periods of the external clock signal CLK.

Specifically, in the case of the PLL circuit, the charge pump circuit which receives the output of the phase comparing circuit has a relatively large time constant so that the voltage-controlled oscillation circuit operates stably. The charge pump circuit having such a large time constant can merely be responsive at most to the change of clock period in an interval of several tens periods of the external clock signal. In short, the voltage-controlled oscillation circuit which produces the internal clock signal cannot respond to the external clock signal which changes the period in a short interval.

The DLL circuit, which resembles the PLL circuit in the arrangement including a phase comparing circuit, charge pump circuit and voltage-controlled variable delay circuit, cannot respond to fast changing periods of the external clock signal either. The SMD circuit needs to produce signals having delay times as long as two periods of the external clock signal CLK and compare the signal phases for timing the internal clock signal to reflect the phase of CLK, and accordingly, it cannot respond to fast changing periods of the external clock signal either.

In conclusion, in case the input clock signal changes in period in a relatively short interval, it is difficult to produce an internal clock signal which responds accurately to changing periods of the input clock signal by being based solely on the relatively simple signal regeneration scheme achieved by the signal phase judging function and signal phase varying function of the PLL circuit, DLL circuit or SMD circuit. In the following description, the internal clock signal produced based on the above-mentioned signal phase judging function and signal phase varying function will be called the internally regenerated clock signal so as to distinguish it from the internal clock signal that is virtually the input clock signal fed through a buffer.

The external clock signal CLK shown in FIG. 10 is designed to have a first period tck for the first clock period from time point t0 to t1 and second clock period from t1 to t2, and a second period tck+α a which is longer then tck by α for the third clock period from time point t2 to t3.

The clock regenerating circuit 3 produces an internally regenerated clock signal DCLK in response to the external clock signal having these changing periods. The internally regenerated clock signal DCLK has its resulting period determined from the changing periods of the external clock signal CLK supplied to the clock regenerating circuit 3 and from its circuit arrangement. On the timing chart of FIG. 10, the internally regenerated clock signal DCLK is shown to have the above-mentioned first period tck for the simplicity of explanation.

Read command data is entered to the semiconductor device through the /RAS, /CAS, ICS and /WE terminals and part of address terminals by being timed to the rise of the external clock signal CLK at time point t0. The read command data, which is shown in FIG. 2, is decoded by the decoder 21 so that it is developed into various control signals.

The internally regenerated clock signal DCLK shown in FIG. 10 rises from low to high at time points t1', t2' and t3' in synchronism with the rise of the external clock signal CLK at time points t1, t2 and t3. The rising time points t1', t2' and t3' of DCLK precede the rising time points t1, t2 and t3 of CLK by the time length of signal phase compensation of the clock regenerating circuit 3 mentioned previously.

The leading data DQ in the burst read-out operation has its output level settling at time point t2 which is later by two CLK cycles than the read command input at t0 in compliance with the CAS latency of 2. More specifically, the leading data (data 1) out of the 2-bit data to be read out successively has its output level settling at the rise of CLK at time point t2.

In the semiconductor device, the leading data DQ is released by being timed to the time point t2' which is determined by the internally regenerated clock signal DCSK. The time point t2' is derived from the rise of the external clock signal CLK at time point t2, with the setup and hold time toh being added for the output of data DQ. The time length toh is set with reference to the relation with the external device, such as a memory controller (memory control circuit or control chip) or CPU (central processing unit), which reads data in synchronism with the clock signal CLK.

In case the clock regenerating circuit 3 produces an internally regenerated clock signal DCSK having a period equal to the above-mentioned first period tck, a sufficient hold time toh is provided before the time point t2, enabling the external device such as a memory control controller or CPU to read the data data placed on the data terminal DQ of the SDRAM correctly.

At time point t3 following the expiration of the second period tck+α after the rise of the external clock signal CLK at t2, the external clock signal CLK rises again. The internally regenerated clock signal DCSK rises again at time point t3' which precedes the rising of CLK at t3. The data output DQ is of the second data data2 which is timed to the internally regenerated clock signal rising at time point t3'.

The output duration for the first data data1 and the output duration for the second data data2 are virtually a constant time length determined from the internally regenerated clock signal DCSK. Accordingly, the hold time, which is determined from the relation with the external clock signal CLK, of data data2 at t3 is shorter by α than the hold time of data data2 at t2. Due to the reduced hold time, it is difficult for the external device of the SDRAM to receive correctly the data which is read out of the SDRAM.

The semiconductor device of this embodiment includes much desirable switching control for the clock regenerating circuit 3 associated with the selection or switching of the SDR-spec SDRAM and DDR-spec SDRAM. Specifically, according to this embodiment, when the semiconductor device configures an SDR-spec SDRAM, the clock signal 7 produced by the clock generation circuit 4 is used as clock signal DCLK, instead of using the clock regenerating circuit 3.

In this case, the clock generation circuit 4 inevitably has a virtually constant signal delay after the supply of external clock signal CLK until the release of internal clock signal 7. In addition, it is not possible to produce an internal clock signal which is capable of compensating the signal propagation delay of internal circuits mentioned above based solely on the buffering of the external clock signal by the input circuit, or in other words based solely on the clock signal production in a passive manner. Such a signal delay and the like can possibly hamper the fast operation expected inherently of the SDRAM. However, the results of various studies suggest the successful achievement of the intended operational characteristics thanks to the recent advances in semiconductor integrated circuit technology.

Next, when the semiconductor device configures a DDR-spec SDRAM, the clock signal 6 produced by the clock regenerating circuit 3 is used as clock signal DCLK. In this case, the clock regenerating circuit 3 can produce an internal clock signal which is relatively accurate and is capable of compensating the above-mentioned signal propagation delay, enabling the SDRAM to operate sufficiently fast.

Figure 11:
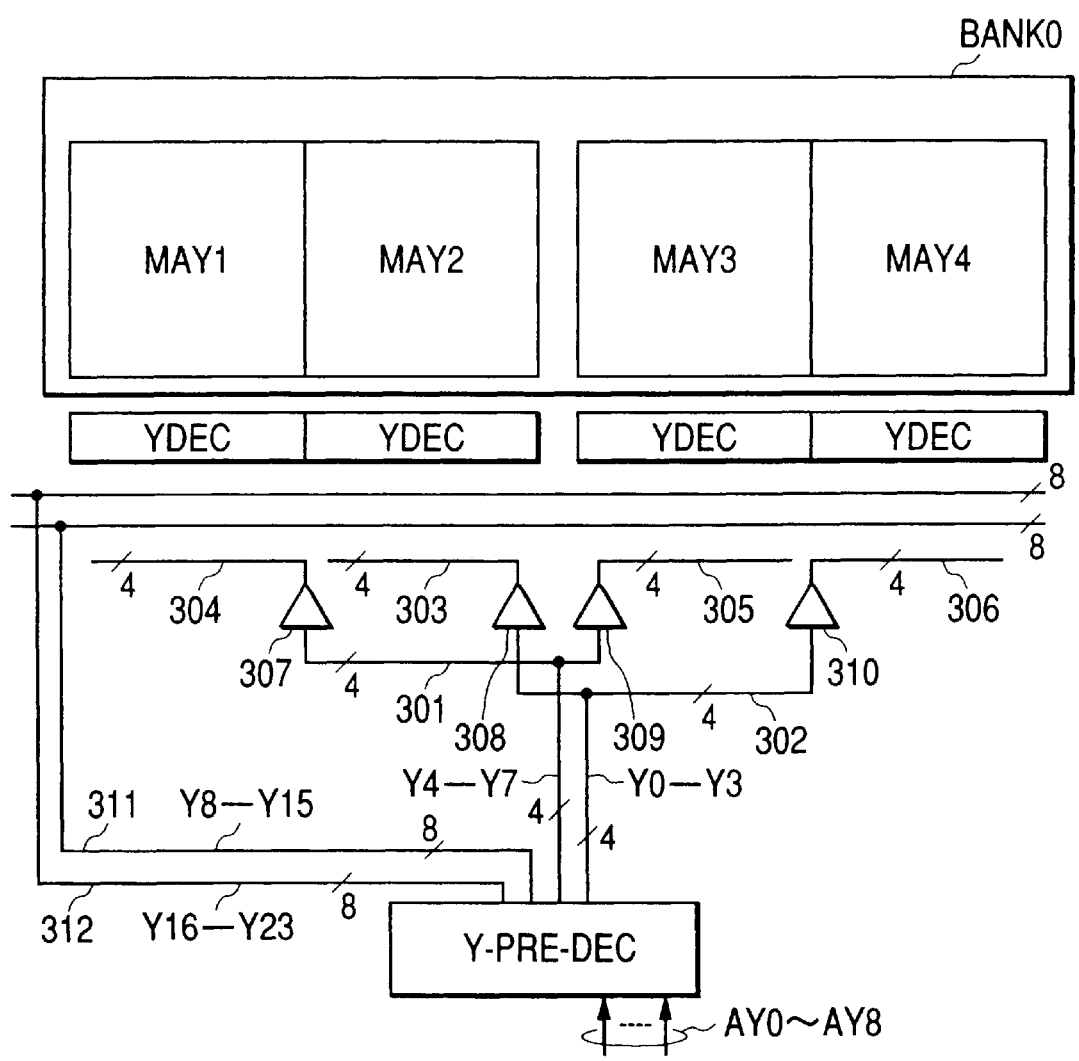
FIG. 11 is a block diagram illustrating the transfer route of the y-system pre-decoded signals.

FIG. 11 explains the transfer route of the decoded signals sent from the y-system pre-decoder Y-Pre-Dec to the y-system decoders YDEC. Shown in FIG. 11 is part of the overall block diagram of FIG. 2 and FIG. 3 including four memory arrays MAY1–MAY4 of the memory bank BankO, four y-system decoders YDEC which correspond to the memory arrays, a y-system pre-decoder Y-Pre-Dec, and four drivers 307–310.

The y-system pre-decoder Y-Pre-Dec receives the 9-bit address signal AYO–AY7 and produces 24-bit decoded signals YO–Y23 based on the following partial decoding scheme. The 8-bit decoded signals YO–Y7 as the first pre-decoded signal are produced by decoding a 3-bit y-system address signal AYO–AY2. The 3-bit y-system address signal AYO–AY2 is used for the count operation of the burst counter. The 8-bit decoded signals Y8–Yl5 as the second pre-decoded signal are produced from a 3-bit y-system address signal AY3–AY5. The 8-bit decoded signals Y16–Y23 as the third pre-decoded signal are produced from a 3-bit y-system address signal AY6–AY8.

The decoded signals YO–Y3 are sent to the drivers 308 and 310 over signal lines 302. The drivers 308 and 310 amplify the decoded signals YO–Y3 and place the amplified signals on signal lines 303 and 306, respectively. The drivers 308 and 310 are provided so that the decoded signals YO–Y3 reach the y-system decoders YDEC corresponding to the memory arrays MAY2 and MAY4 fast without a time difference. The decoded signals Y4–Y7 are sent to the drivers 307 and 309 over signal lines 301. The drivers 307 and 309 amplify the decoded signals Y4–Y7 and place the amplified signals on signal lines 304 and 305. The drivers 307 and 309 are provided so that the decoded signals Y4–Y7 reach the y-system decoders YDEC corresponding to the memory arrays MAY1 and MAY3 fast without a time difference. The decoded signals Y8–Y15 are placed intact on the signal lines 311, and the decoded signals Y16–Y23 are placed intact on the signal line 312.

The signal lines 303–306 are provided individually for the memory arrays MAY1–MAY4, whereas the signal lines 311 and 312 are provided in common to the memory arrays MAY1–MAY4. This signal line layout for the distribution of pre-decoded signals achieves the following effectiveness.

The 3-bit y-system address signal AYO–AY2 is used for the address signal of the count operation of the burst counter. Therefore, in the burst operation with a burst length of 2 or more, only 3 address bits AYO–AY2 out of the 9-bit y-system address signal AYO–AY8 are varied. In the continuous read or write operation with a burst length of 2 or more, it is crucial to produce the decoded signals YO–Y7 from the 3-bit y-system address signal AYO–AY2 fast and transfer the decoded signals YO–Y7 to the y-system decoder YDEC fast.

In order to speed up the signal transfer from the y-system pre-decoder Y-Pre-Dec to the y-system decoders YDEC, the inventive semiconductor device is designed to transfer the signals between these decoders through drivers, shorten the signal lines 303–306 connected to the y-system pre-decoder Y-Pre-Dec, and reduce the number of circuit elements connected to the signal lines 303–306.

Figure 12:
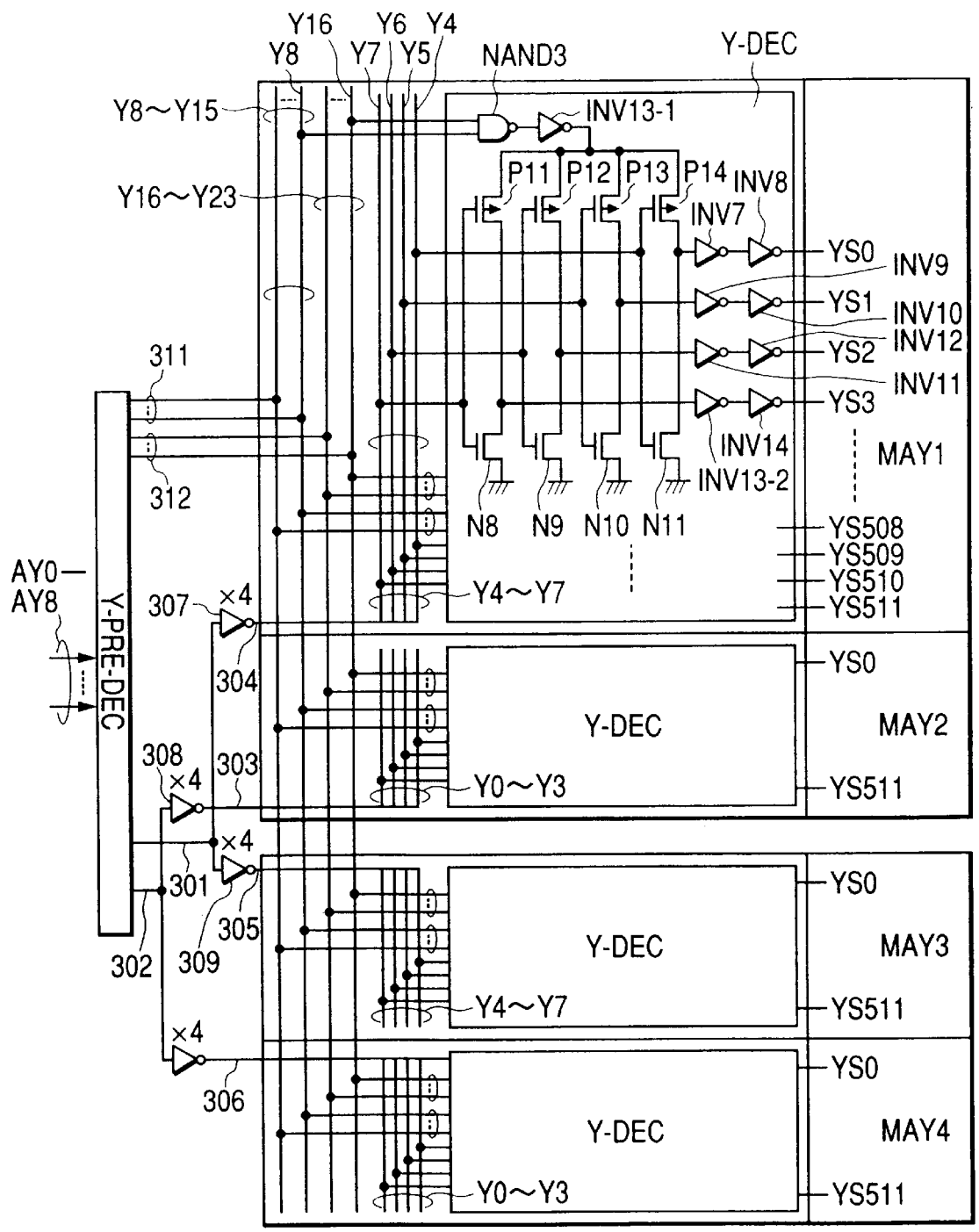
FIG. 12 is a schematic diagram of the y-system decoder.

FIG. 12 shows the detailed arrangement of the y-system decoder, in which the signal lines of the decoded signals have already been explained in connection with FIG. 10.

Shown in FIG. 11 are four y-system decoders YDEC which correspond to the memory arrays MAY1–MAY4. The y-system decoder for each memory array MAY1–MAY4 has inputs for receiving the decoded signals YO–Y23 and outputs connected to the y-selection lines YSO–YS512. The memory arrays MAY1–MAY4 have two memory mats each. The y-selection lines YSO–YS255 are for the odd-numbered memory mats MAT, and the y-selection lines YS256–YS511 are for the even-numbered memory mats MAT. For example, the y-selection lines YSO–YS255 correspond to the memory mat MAT1 included in the memory array MAY, while the y-selection lines YS256–YS511 correspond to the memory mat MAT2.

First, the circuit arrangement of the y-system decoder YDEC which corresponds to the memory array MAY1 will be explained. This y-system decoder YDEC includes a NAND gate NAND3, inverters INV7–INV13, n-channel MIS transistors N8N11, and p-channel MIS transistors PII–P14. These circuit elements correspond to the y-selection lines YSO–YS3, and there are the same sorts of elements (not shown) corresponding to the remaining lines YS4–YS511. The explanation of the circuit elements corresponding to the y-selection lines YS5–YS63 is omitted.

The NAND gate NAND3 has its input receiving the decoded signals Y8 and Y16, and its output connected to the input of the inverter INV13-1. The p-channel MIS transistor P11 and n-channel MIS transistor N8 form an inverter circuit, which receives the decoded signal Y7 on its input and has its output connected to the input of the inverter INV13-2. The p-channel MIS transistor P11 has its source connected to the output of the inverter INV13-1. The inverter INV14 has its input receiving the output of the inverter INV13-2, and its output connected to the y-selection line YS3. Accordingly, the y-selection line YS3 has a high level (selection level) when the decoded signals Y8 and Y16 are high and Y7 is low.

The p-channel MIS transistor P12 and n-channel MS transistor N9 form an inverter circuit, which receives the decoded signal Y6 on its input and has its output connected to the input of the inverter INV11. The p-channel MIS transistor P12 has its source connected to the output of the inverter INVI3-1. The inverter INV12 has its input receiving the output of the inverter INV11, and its output connected to the y-selection line YS2. Accordingly, the y-selection line YS2 has a high level (selection level) when the decoded signals Y8 and Y16 are high and Y6 is low.

The p-channel MIS transistor P13 and n-channel MIS transistor N10 form an inverter circuit, which receives the decoded signal Y5 on its input and has its output connected to the input of the inverter INV9. The p-channel MIS transistor P13 has its source connected to the output of the inverter INV13-1. The inverter INV10 has its input receiving the output of the inverter INV9, and its output connected to the y-selection line YS1. Accordingly, the y-selection line YS1 has a high level (selection level) when the decoded signals Y8 and Y16 are high and Y5 is low.

The p-channel MIS transistor P14 and n-channel MIS transistor N11 form an inverter circuit, which receives the decoded signal Y4 on its input and has its output connected to the input of the inverter INV7. The p-channel MIS transistor P14 has its source connected to the output of the inverter INV13-1. The inverter INV8 has its input receiving the output of the inverter INV7, and its output connected to the y-selection line YSO. Accordingly, the y-selection line YSO has a high level (selection level) when the decoded signals Y8 and Y16 are high and Y4 is low.

Based on this circuit arrangement, each of the 256 y-selection lines YSO–YS255 has its signal level determined by three signals, which are one of four decoded signals Y4–Y7 (or YO–Y3), one of eight decoded signals Y8–Y15, and one of eight decoded signals Y16–Y23. The remaining selection lines YS256–YS511 have the same signal levels as the selection lines YSO–YS255, respectively. Namely, a y-selection line YSn and a y-selection line YSn+256 (where n ranges from 0 to 255) have the same level (selection level). Specifically, when the decoded signals Y8 and Y16 are high and Y4 is Low, the y-selection lines YSO and YS256 have a high level (selection level).

The driver 307 provided for the memory array MAY1 includes four drivers which produce decoded signals Y4–Y7. The driver 309 provided for the memory array MAY3 includes four drivers which produce decoded signals Y4–Y7. The driver 308 provided for the memory array MAY2 includes four drivers which produce decoded signals YO–Y3. The driver 310 provided for the memory array MAY4 includes four drivers which produce decoded signals YO–Y3.

Next, the operation of the y-system decoder YDEC will be explained for the cases of a SDR-spec SDRAM and DDR-spec SDRAM of X16 bits line scheme, i.e., 16-bit simultaneous input/output.

First, the operation of the y-system decoder YDEC of the SDR-spec SDRAM will be explained. The y-system pre-decoder Y-Pre-Dec receives a 3-bit y-system address signal AYO–AY2 and releases a low-level (selection level) signal for one of the decoded output signals YO–Y7, with the rest being left high. It receives a 3-bit y-system address signal AY3–AY5 to release a high-level (selection level) signal for one of the decoded output signals Y8–Yl5, with the rest being left low. It receives a 3-bit y-system address signal AY6–AY8 to release a high-level (selection level) signal for one of the decoded output signals Y16–Y23, with the rest being left low.

In consequence, a total of four y-selection lines, i.e., two lines from each of two memory arrays of the four memory arrays of the memory bank BankO, are selected. One y-selection line controls four y-switches YSW, so that it selects four data lines pairs. Accordingly, for the SDR-spec SDRAM of X16 bits line scheme, four y-selection lines of a selected memory bank are selected, and a total of 16 data line pairs are selected by four y-selection lines.

Next, the operation of the y-system decoder YDEC of the DDR-spec SDRAM will be explained. The y-system pre-decoder Y-Pre-Dec receives a 3-bit y-system address signal AYO–AY2 and releases a low-level (selection level) signal for one of the decoded output signals YO–Y7, as in the case of the SDR-spec SDRAM. The difference from the SDR-spec SDRAM is that the y-system address signal AYO–AY2 have same levels as the y-system address signal AY3–AY5, respectively.

In consequence, a total of eight y-selection lines, i.e., two lines from all four memory arrays of the memory bank BankO, are selected. One y-selection line controls four y-switches YSW, so that it selects four data line pairs. Accordingly, for the DDR-spec SDRAM of X16 bits line scheme, four y-selection lines of a selected memory bank are selected, and a total of 32 data line pairs DL are selected by eight y-selection lines. For example, in the read-out operation, data which has been read out onto the 32 pairs of data line pairs DL is released out of the SDRAM by being timed to the low-to-high transitions and high-to-low transitions of the clock signal.

The semiconductor device has a maximum burst length of 8, although no limitation is imposed on the invention in this regard. Address bits AY1 and AY2 of the 2-bit y-system address signal are each up-counted by 1 by the binary counter BC, so that four sets of y-system address signals are produced. The remaining address bits AY3–AY8 are left unvaried. Data read out in one access is released out of the SDRAM by being divided in two times. Data is released out of the SDRAM eight times successively. At this time, the y-system address signal up-counted by the binary counter BC is decoded by the y-system pre-decoder Y-Pre-Dec, which then releases address signals Y4–Y7. Accordingly, during the periods (burst periods) of data read-out equal in number to the burst length, the address signals Y4–Y7 vary three times, while the address signals Y8–Y23 are unvaried. On this account, in order to read out data fast in the burst period, it is crucial to send the address signals Y4–Y7 fast to the y-system decoders YDEC.

In the inventive semiconductor device, the divided address signals YO–Y3 and Y4–Y7 are allotted to the memory mats. The signal lines for sending the y-system address signals which vary in the burst period are divided for each memory array and driven by individual drivers, so that the input capacitance of the circuit elements connected to the y-system address signal liked is reduced, whereby it becomes possible to read out data fast in the burst period.

While the present invention has been described for the specific embodiment, the invention is not confined to this embodiment, but various changes can be made obviously without departing from the essence of the invention.

Although in the foregoing embodiment, the clock regenerating circuit 3 and clock generation circuit 4 are provided independently, these and other circuits having like functions or like arrangements, such as the output stage, may be unified.

The clock generation circuit 4 is not necessarily a simple passive circuit such as a buffer circuit, but if an increased power consumption and increased number of circuit elements are permitted, it may have a more intricate arrangement recognized to be a sync signal generation circuit which is responsive to the external clock signal with changing periods and produces a clock signal with the property of compensation of the signal propagation delay of the internal circuits.

For example, the clock generation circuit 4 may be arranged identically to the clock regenerating circuit 3 to include a phase comparing circuit, a charge pump circuit, a voltage-controlled oscillation circuit, a delay circuit as a replica circuit, and an operation control circuit. In case the external clock signal has a relatively simple period alteration pattern having first and second periods as mentioned previously, the voltage-controlled oscillation circuit used in the clock generation circuit 4 can have its ring oscillator circuit elements replaced partially with a first gate circuit with reference propagation characteristics and a second gate circuit with propagation characteristics different from the former one, thereby to be operative for changing the oscillation period in response to fast changing periods of the external clock signal. The signal path through the first gate circuit or the signal path through the second gate circuit is selected by an operation control circuit, which may include a clock period detecting circuit for detecting the phase difference of the oscillation output from the external clock signal during the period when the signal path through the first gate circuit is selected, a detection circuit for detecting the period alteration pattern of the external clock signal based on the output of the clock period detecting circuit and on the comparison with several stored reference patterns, and a sequential circuit which switches the first and second gate paths by being determined of the signal output order by the output of the pattern detecting circuit and controlled for the sequential operation by the output of the voltage-controlled oscillation circuit.

A more accurate internal clock signal can be produced by controlling the delay time of the second gate circuit which is provided with a control terminal for it. The output frequency of the whole voltage-controlled oscillation circuit and the delay time of the second gate circuit are each controlled appropriately. The voltage-controlled oscillation circuit is controlled preferably based on the result of phase comparison obtained when the first gate path is selected and on the output of the charge pump. The delay time of the second gate circuit may be controlled based on the phase comparison without a time limit and the output of the charge pump.

If such an increased complexity is permitted, the clock generation circuit 4 will have the same componential circuits as those of the clock regenerating circuit 3. These circuits 3 and 4 may be unified so that the same componential circuits are shared. These circuits 3 and 4 have distinct functions, but are substantially one unit on the semiconductor chip.

The effectiveness achieved by the present invention is summarized as follows.

(1) The single uniform semiconductor chip can be configured to provide for switching between two types of SDRAM: SDR-spec SDRAM and DDR-spec SDRAM. The SDR-spec SDRAM enables application electronic systems, which alter the clock period periodically, to transact data without error, and the DDR-spec SDRAM enables application electronic systems, which have high clock frequencies, to transact data accurately.

(2) The uniform semiconductor chip functioning as a SDR-spec SDRAM can have separate data lines for read-out data and input data to be stored, and accordingly can process both types of data simultaneously. The semiconductor device does not have separate data lines for the SDR-spec SDRAM and DDR-spec SDRAM, enabling a smaller chip area.

(3) The uniform semiconductor chip functioning as a SDR-spec SDRAM or DDR-spec SDRAM can place input data to be stored on the internal data lines at the optimal timing of each type of SDRAM.

(4) The SDR-spec SDRAM and DDR-spec SDRAM can have different control timings (data mask control timings) of the validation or invalidation of data entered to the data input circuit in compliance with their different data entries of both types of SDRAM.

We claim:

1. A semiconductor device comprising:
an internal circuit;
a signal generation circuit which produces a selection signal; and
a clock input circuit including a first clock signal output circuit which receives a first clock signal and outputs a second clock signal which is a delayed version of said first clock signal with a first delay time and a second clock signal output circuit which receives said first clock signal and outputs a third clock signal which is a delayed version of said first clock signal with a second delay time;

wherein said internal circuit is operable based on said second clock signal in case that said selection signal is in a first state,
wherein said internal circuit is operable based on said third clock signal in case that said selection signal is in a second state,
wherein said first delay time is controlled to vary correspondingly with the variation in frequency of said first clock signal, and said second delay time is controlled to be fixed correspondingly with the variation in frequency of said first clock signal, and
wherein power is not supplied to said first clock signal output circuit in case that said selection signal is in said second state so that said first clock signal output circuit is not activated.

2. A semiconductor device according to claim 1, wherein said signal generation circuit has a terminal, and said selection signal is determined to have the first state or second state depending on the voltage applied to said terminal.

3. A semiconductor device according to claim 2, wherein said terminal is brought to an electrical floating state or applied a predetermined voltage.

4. A semiconductor device according to claim 1 further including a memory mat having a plurality of memory cells, wherein said first clock signal is supplied from the outside of said semiconductor device, and said internal circuit includes an output circuit which outputs data read out of said memory mat to the outside of said semiconductor device.

5. A semiconductor device according to claim 1, wherein said clock input circuit includes a selection circuit which has a first input terminal for receiving said second clock signal, a second terminal for receiving said third clock signal, a control terminal for receiving said selection signal, and an output terminal connected to said output circuit,
said selection circuit outputting said second clock signal to said output terminal if said selection signal is in the first state, or outputting said third clock signal to said output terminal if said selection signal is in the second state.

6. A semiconductor device according to claim 1 further including a memory mat having a plurality of dynamic memory cells, wherein said semiconductor device configures a semiconductor memory device of Double Data Rate type if said selection signal is in said first state, or configures a semiconductor memory device of Single Data Rate type if said selection signal is in said second state.

7. A semiconductor device according to claim 1 further including a memory mat having a plurality of memory cells, wherein said internal circuit includes an output circuit which outputs data read out of said memory mat,
said output circuit outputting data which is read out of said memory mat in a period twice the length of a period of said first clock signal if said selection signal is in said first state, or outputting data which is read out of said memory mat in the period of said first clock signal if said selection signal is in said second state.

8. A semiconductor device according to claim 1, wherein said second clock signal output circuit includes a buffer circuit which receives said first clock signal and outputs said third clock signal, said buffer circuit having a delay time which is constant irrespective of the change in frequency of said first clock signal.

9. A semiconductor device according to claim 1, wherein said first clock signal output circuit comprises a circuit which compares the phases of said first clock signal with said second clock signal and produces said second clock signal in accordance with the result of comparison.

10. A semiconductor device according to claim 1, wherein said first clock signal output circuit includes a delayed lock loop circuit.

11. A semiconductor device according to claim 4, wherein said first delay time is a delay time which is corresponding with the delay time of said output circuit.

12. A semiconductor device according to claim 1, wherein said first clock signal output circuit is deactivated if said selection signal is in said second state.

13. A semiconductor device comprising:

a memory mat having a plurality of memory cells;

a signal generation circuit which outputs a selection signal;

a first circuit which includes a clock regenerating circuit which is controlled by said selection signal and outputs a second clock signal which is corresponding with a first clock signal; and a second circuit which outputs data read out of said memory mat in response to said second clock signal, wherein said clock regenerating circuit produces a third clock signal which is a delayed signal of said first clock signal with a first delay time, said first delay time is controlled to vary correspondingly with the variations in frequency of said first clock signal, power is supplied to said clock regenerating circuit so that said clock regenerating circuit is activated if said selection signal is in a first state, and said power is not supplied to said clock regenerating circuit so that said clock regenerating circuit is deactivated if said selection signal is in a second state, said first circuit outputs said second clock signal in case that said selection signal is in said first state, and said first circuit outputs said second clock signal in case that said selection signal is in said second state.

14. A semiconductor device according to claim 13, wherein said signal generation circuit has a terminal, and said selection signal is determined to have the first state or second state depending on the voltage applied to said terminal.

15. A semiconductor device according to claim 14, wherein said terminal is brought to an electrical floating state or applied a predetermined voltage.

16. A semiconductor device according to claim 13, wherein said first clock signal is supplied from the outside of said semiconductor device, and said second circuit outputs data read out of said memory mat to the outside of said semiconductor device.

17. A semiconductor device according to claim 13, wherein said first circuit includes a fourth clock signal output circuit which receives said first clock signal and outputs a fourth clock signal which is corresponding with said first clock signal, and a selection circuit which includes a first and second input terminals for receiving said third and fourth clock signals, respectively, a control terminal for receiving said selection signal and an output terminal for outputting said second clock signal, said selection circuit outputting said third clock signal to said output terminal if said selection signal is in said first state and outputting said fourth clock signal to said output terminal if said selection signal is in said second state.

18. A semiconductor device according to claim 17, wherein said-fourth clock signal output circuit includes a buffer circuit which receives said first clock signal and outputs said fourth clock signal, said buffer circuit having a constant delay time.

19. A semiconductor device according to claim 13, wherein said memory cells comprise dynamic memory cells, and said semiconductor device configures a semiconductor memory device of Double Data Rate type if said selection signal is in said first state, or configures a semiconductor memory device of Single Data Rate type if said selection signal is in said second state.

20. A semiconductor device according to claim 19, wherein said second circuit outputs data which is read out of said memory mat, twice for a period of said first clock signal in case that said selection signal is in said first state, and outputs data, which is read out of said memory mat, one time for a period of said first clock signal in case that said selection signal is in said second state.

21. A semiconductor device according to claim 13, wherein said clock regenerating circuit comprises a circuit which compares the phases of said first clock signal with said second clock signal and produces said second clock signal in accordance with the result of comparison.

22. A semiconductor device including:

an internal circuit;

a signal generation circuit which outputs a selection signal; and a clock input circuit including a first clock signal output circuit and a second clock signal output circuit, said first clock signal output circuit having a phase judgement function and a phase adjustment function and operating to receive a first clock signal and produce a second clock signal which is synchronized and phase-controlled with respect to said first clock signal, said second clock signal output circuit operating to receive said first clock signal and produce a third clock signal based on the buffering of said first clock signal, wherein if said selection signal is in a first state, said internal circuit is enabled to operate based on said second clock signal, wherein if said selection signal is in a second state, said internal circuit is enabled to operate based on said third clock signal, and wherein power is not supplied to said first clock signal output circuit if said selection signal is in second state so that said first clock signal output circuit is not activated.

23. A semiconductor device according to claim 22 further including a memory mat including a plurality of memory cells, wherein said first clock signal is supplied from outside of said semiconductor device, and said internal circuit includes an output circuit which releases data read out of said memory mat to the outside of said semiconductor device.

24. A semiconductor device according to claim 22, wherein said signal generation circuit has a bonding pad, and said selection signal is determined to have said first state or said second state depending on the voltage applied to said bonding pad.

25. A semiconductor device according to claim 22, wherein said signal generation circuit has a terminal, and said selection signal is determined to have said first state or said second state depending on the voltage applied to said terminal.

26. A semiconductor device according to claim 25, wherein said terminal is brought to an electrical floating state or applied a predetermined voltage.

27. A semiconductor device according to claim 22,
wherein said semiconductor device is configured as a semiconductor memory device of Double Data Rate type if said selection signal is in said first state, or is configured as a semiconductor memory device of Single Data Rate type if said selection signal is in said second state.

28. A semiconductor device comprising:

a plurality of memory cells; and a mode setting circuit which designates a Double Data Rate mode or a Single Data Rate mode for accessing said plurality of memory cells; and a clock regenerating circuit which outputs internal clock signals, wherein power is not supplied to said clock regenerating circuit if said mode setting circuit designates said Single Data Rate mode so that said clock regenerating circuit is not activated, and wherein the power is supplied to said clock regenerating circuit if said mode setting circuit designates said Double Data Rate mode so that said clock regenerating circuit is activated.

29. A semiconductor device according to claim 28,
wherein said mode setting circuit has a pad, and designates a Double Data Rate mode or a Single Data Rate mode based on the voltage applied to said pad.

30. A semiconductor device according to claim 29,
wherein said pad is brought to an electrical floating state or applied a predetermined voltage.

31. A semiconductor device according to claim 28,
wherein data from said plurality of memory cells is read out twice for a period of external clock signals if said mode setting circuit designates a Double Data Rate mode, and wherein data from said plurality of memory cells is read out one time for a period of said external clock signals if said mode setting circuit designates a Single Data Rate mode.

32. A semiconductor device comprising:

a plurality of memory cells;

a mode setting circuit which designates a Double Data Rate mode or a Single Data Rate mode for accessing said plurality of memory cells; and a clock regenerating circuit which outputs internal clock signals, wherein said clock regenerating circuit is not activated if said mode setting circuit designates said Single Data Rate mode, wherein said clock regenerating circuit is activated if said mode setting circuit designates said Double Data Rate mode, and wherein said mode setting circuit has a pad, and designates a Double Data Rate mode or a Single Data Rate mode based on the voltage applied to said pad.

33. A semiconductor device according to claim 32,
wherein said pad is brought to an electrical floating state or applied a predetermined voltage.

34. A semiconductor device according to claim 32,
wherein data from said plurality of memory cells is read out twice for a period of external clock signals if said mode setting circuit designates a Double Data Rate mode, and wherein data from said plurality of memory cells is read out one time for a period of said external clock signals if said mode setting circuit designates a Single Data Rate mode.

35. A semiconductor device comprising:

a plurality of memory cells;

a mode setting circuit which designates a Double Data Rate mode or a Single Data Rate mode for accessing said plurality of memory cells; and a clock regenerating circuit which outputs internal clock signals, wherein said clock regenerating circuit is not activated if said mode setting circuit designates said Single Data Rate mode, wherein said clock regenerating circuit is activated if said mode setting circuit designates said Double Data Rate mode, and wherein said clock regenerating circuit comprises a phase-locked loop circuit.

36. A semiconductor device according to claim 35,
wherein data from said plurality of memory cells is read out twice for a period of external clock signals if said mode setting circuit designates a Double Data Rate mode, and wherein data from said plurality of memory cells is read out one time for a period of said external clock signals if said mode setting circuit designates a Single Data Rate mode.

37. A semiconductor device comprising:

a plurality of memory cells;

a mode setting circuit which designates a Double Data Rate mode or a Single Data Rate mode for accessing said plurality of memory cells; and a clock regenerating circuit which outputs internal clock signals, wherein said clock regenerating circuit is not activated if said mode setting circuit designates said Single Data Rate mode, wherein said clock regenerating circuit is activated if said mode setting circuit designates said Double Data Rate mode, and wherein said clock regenerating circuit comprises a synchronous mirror delay circuit.

38. A semiconductor device according to claim 37,
wherein data from said plurality of memory cells is read out twice for a period of external clock signals if said mode setting circuit designates a Double Data Rate mode, and wherein data from said plurality of memory cells is read out one time for a period of said external clock signals if said mode setting circuit designates a Single Data Rate mode.

* * * * *